(12) United States Patent
Lee

(10) Patent No.: US 11,832,433 B2
(45) Date of Patent: Nov. 28, 2023

(54) ARRAY AND PERIPHERAL AREA MASKING

(71) Applicant: Micron Technology, Inc., Boise, ID (US)

(72) Inventor: Kyuseok Lee, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 113 days.

(21) Appl. No.: 17/526,356

(22) Filed: Nov. 15, 2021

(65) Prior Publication Data
US 2023/0157000 A1 May 18, 2023

(51) Int. Cl.
*H10B 12/00* (2023.01)

(52) U.S. Cl.
CPC ............ *H10B 12/09* (2023.02); *H10B 12/50* (2023.02)

(58) Field of Classification Search
CPC ................................ H10B 12/09; H10B 12/50
See application file for complete search history.

(56) References Cited

U.S. PATENT DOCUMENTS

| | | | |
|---|---|---|---|
| 10,607,995 B2 | 3/2020 | Roberts et al. | |
| 2013/0241027 A1* | 9/2013 | Kwak | H01L 21/823431 257/506 |
| 2015/0091127 A1* | 4/2015 | Lee | H10B 12/09 257/506 |
| 2018/0323200 A1 | 11/2018 | Tang et al. | |
| 2019/0103406 A1 | 4/2019 | Tang et al. | |
| 2019/0164985 A1 | 5/2019 | Lee et al. | |
| 2019/0386010 A1* | 12/2019 | Tomoyama | H10B 12/09 |
| 2021/0013226 A1 | 1/2021 | Tang et al. | |
| 2022/0181350 A1* | 6/2022 | Wang | H01L 24/03 |
| 2023/0093872 A1* | 3/2023 | Cho | H10B 12/50 257/296 |
| 2023/0102747 A1* | 3/2023 | Yun | H10B 12/09 257/296 |

* cited by examiner

*Primary Examiner* — Edward Chin
(74) *Attorney, Agent, or Firm* — Brooks, Cameron & Huebsch, PLLC

(57) ABSTRACT

The present disclosure includes apparatuses and methods related to array and peripheral area masking. An example method comprises concurrently forming an array active area mask in an array active area and a peripheral component active area. The method further comprises forming a peripheral component active area mask in the peripheral component active area. The method further comprises concurrently forming etch stop spacers using the array active area mask in the array active area and the peripheral component active area. The method further comprises etching a portion of the peripheral component active area to open peripheral component conductive contact vias using the peripheral component active area mask together with the formed etch stop spacers in order to reduce over-etch of an opening to a device well while increasing surface area opening to a peripheral component conductive contact.

21 Claims, 14 Drawing Sheets

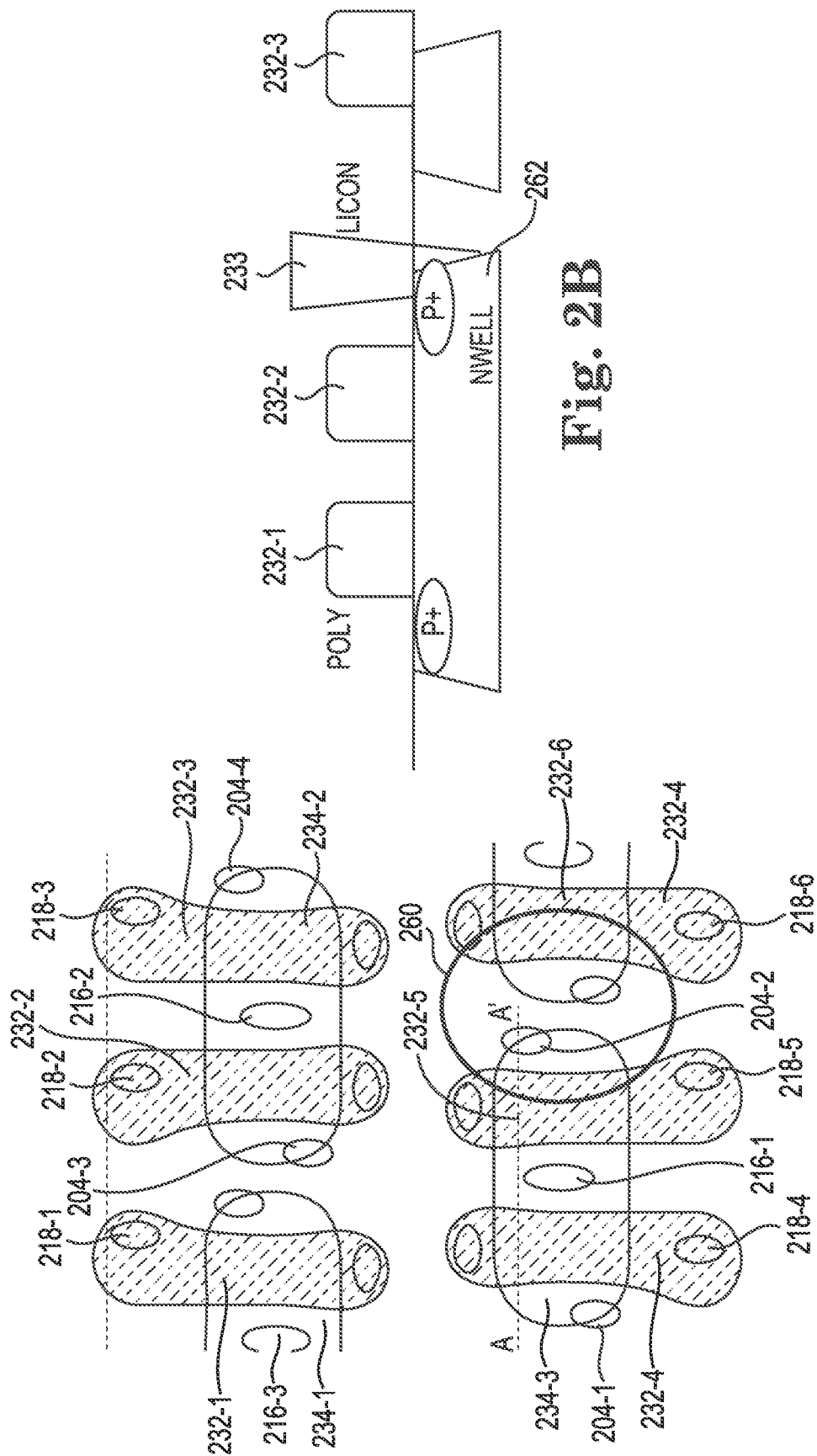

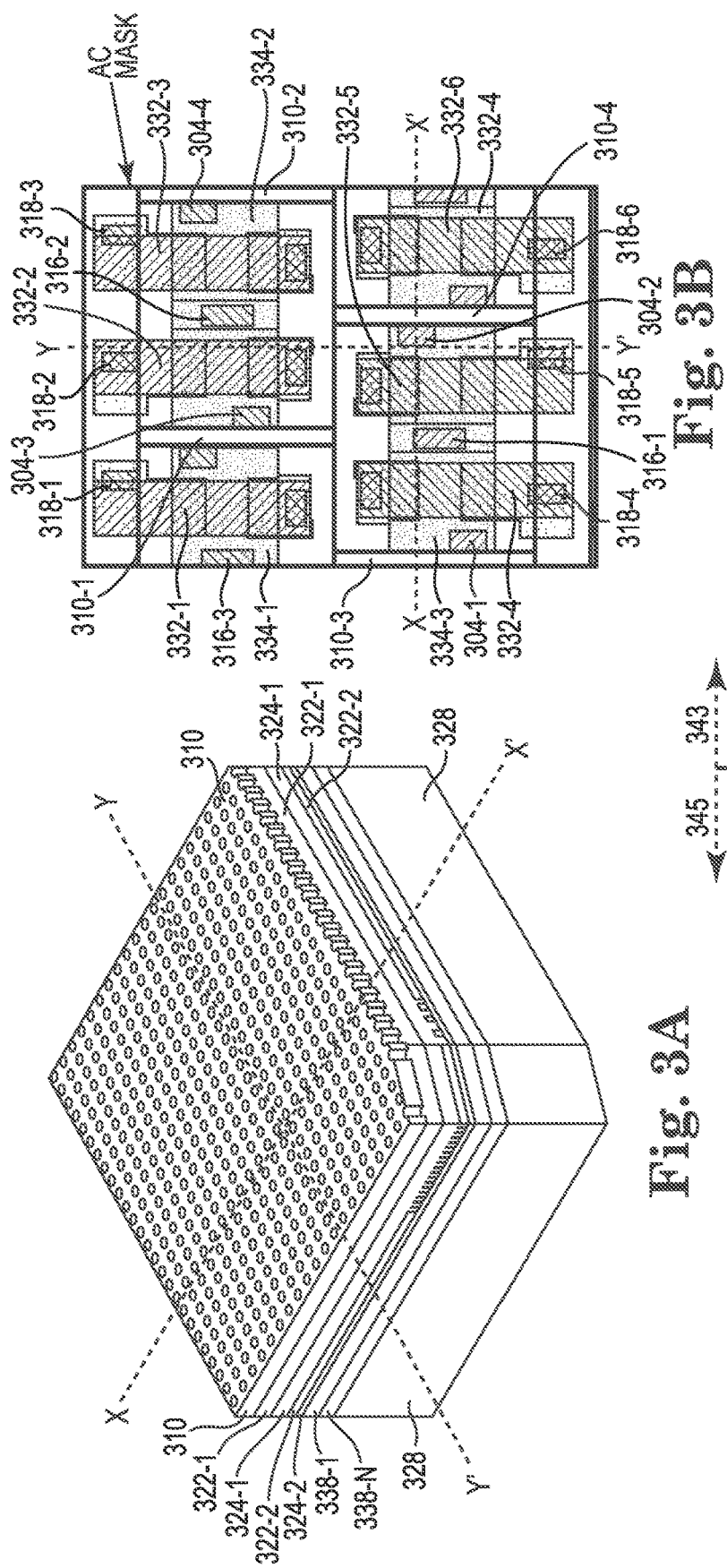
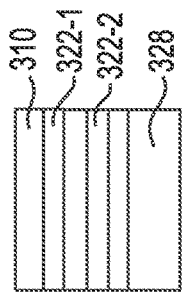
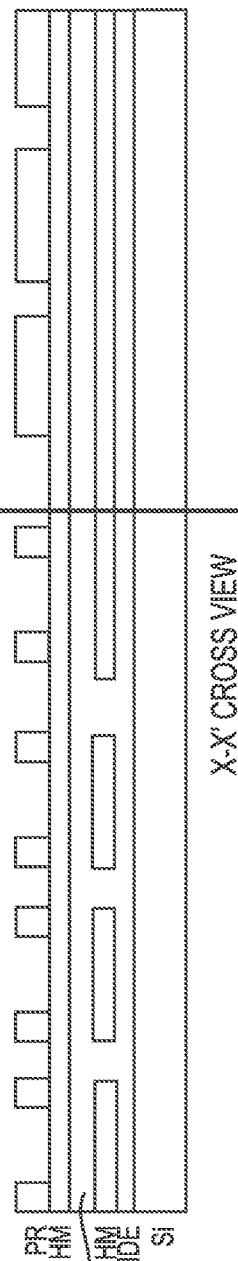
Fig. 3A
Fig. 3B
Fig. 3C

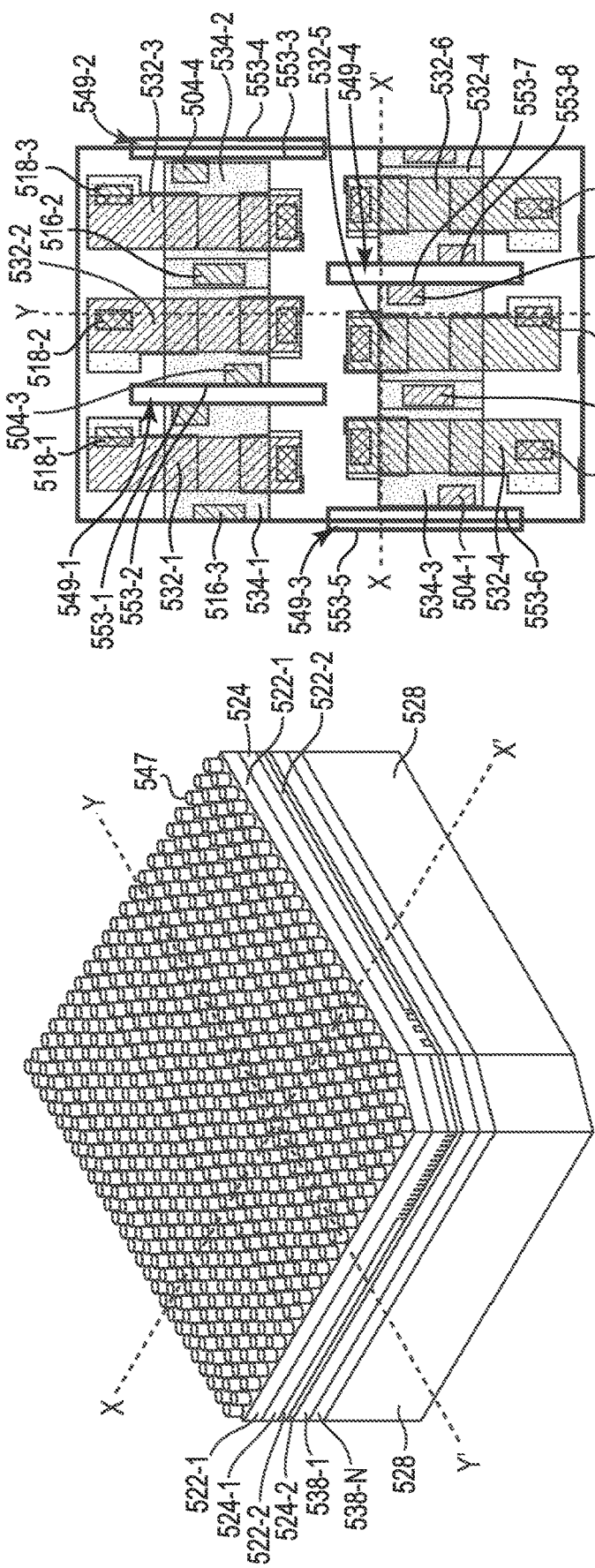
Fig. 5A
Fig. 5B
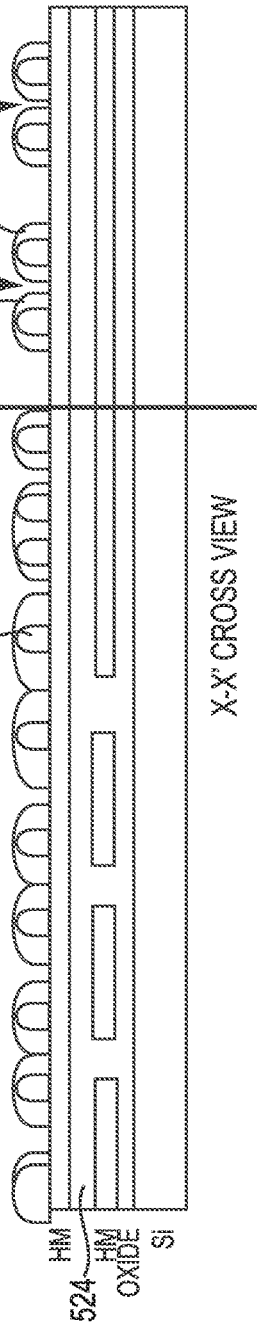
Fig. 5C

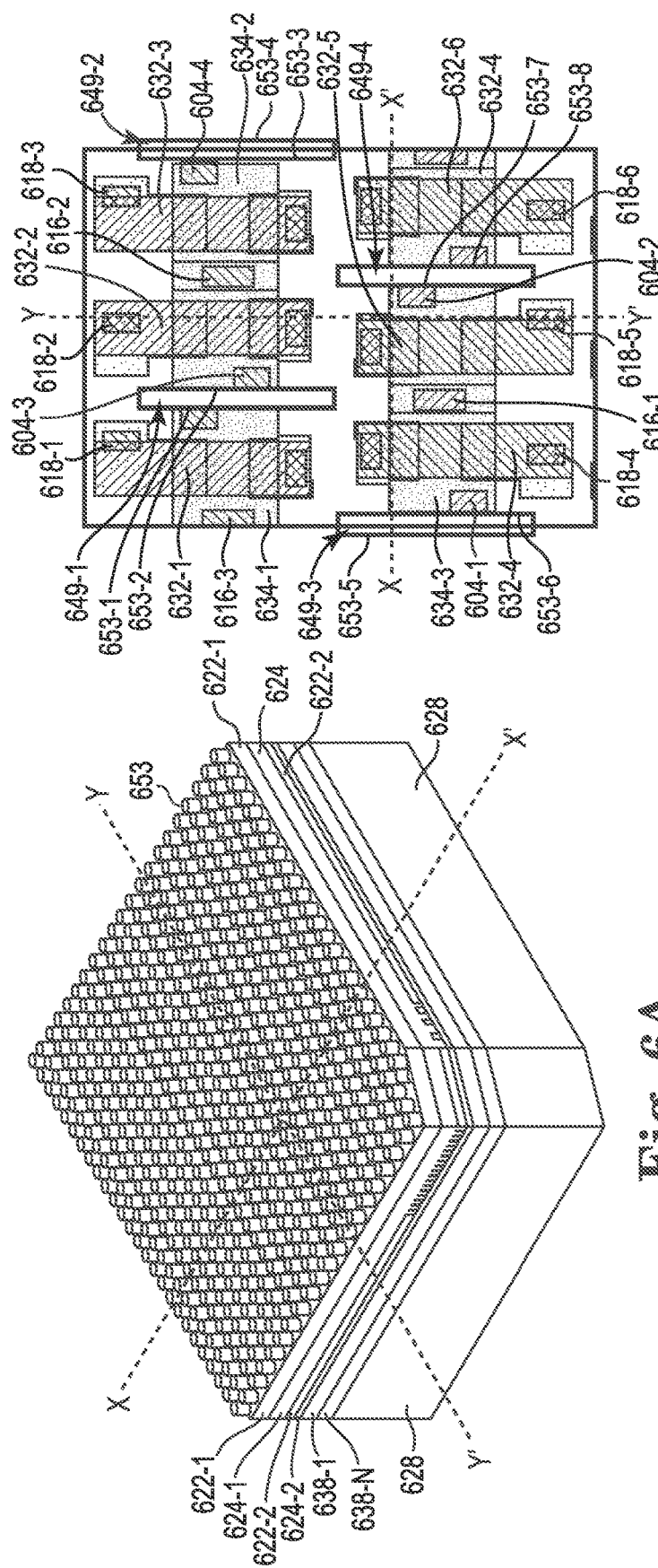
Fig. 6A
Fig. 6B
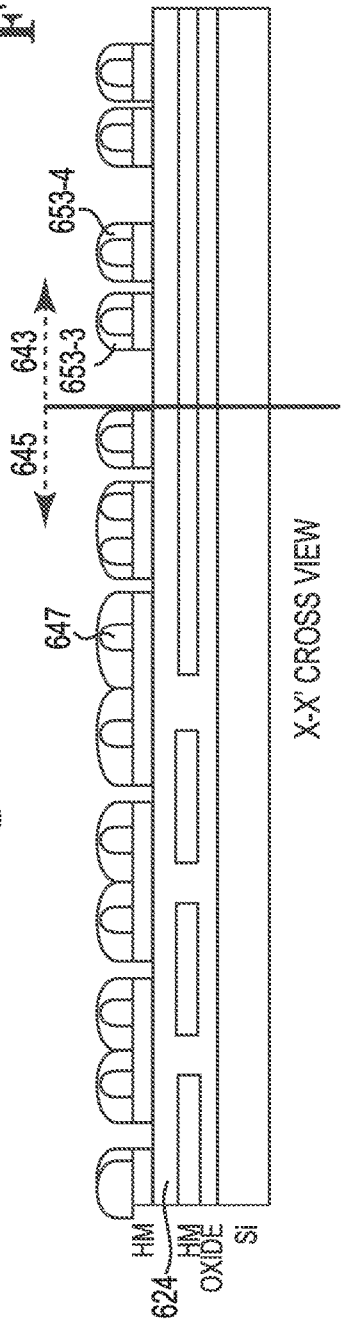
Fig. 6C

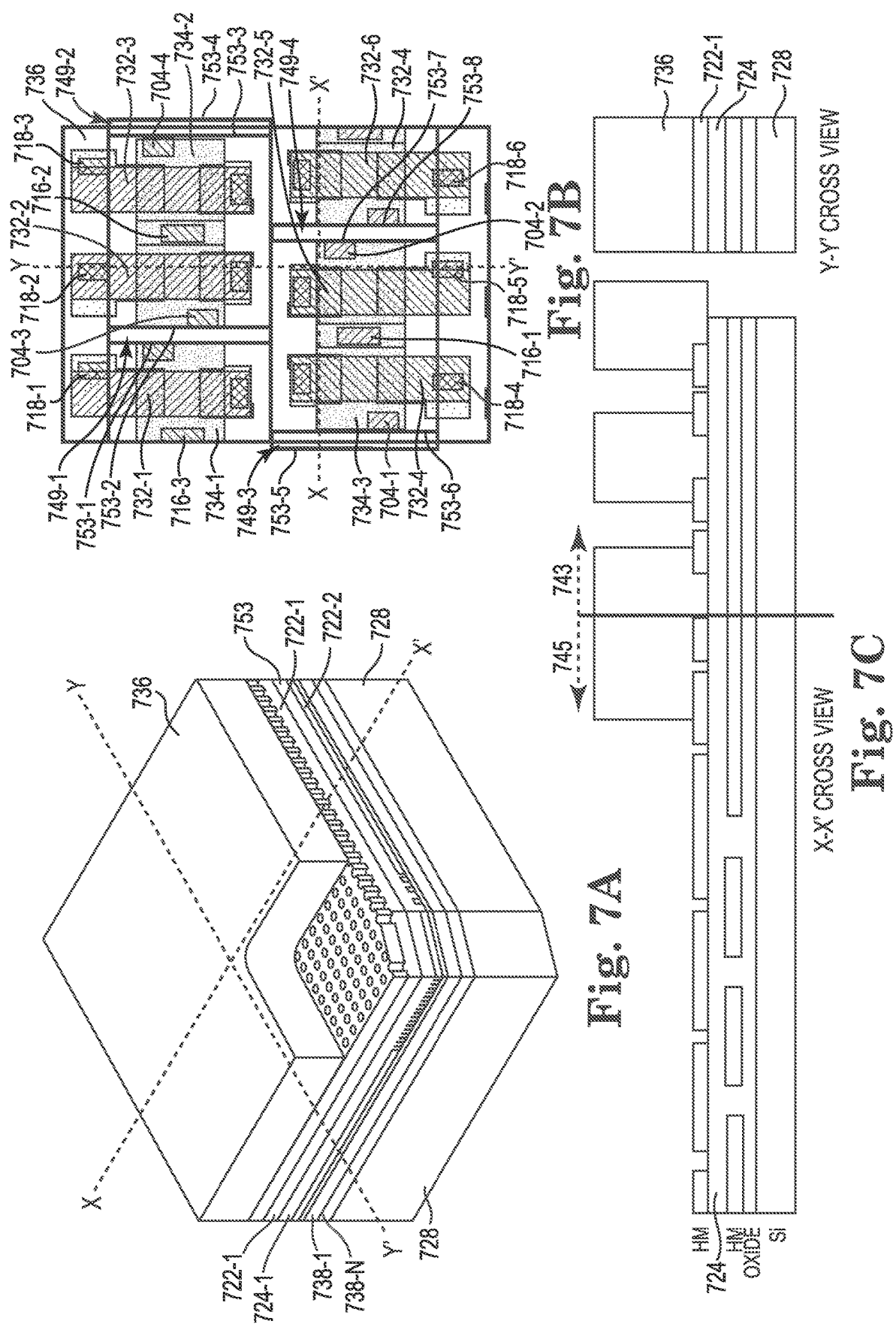

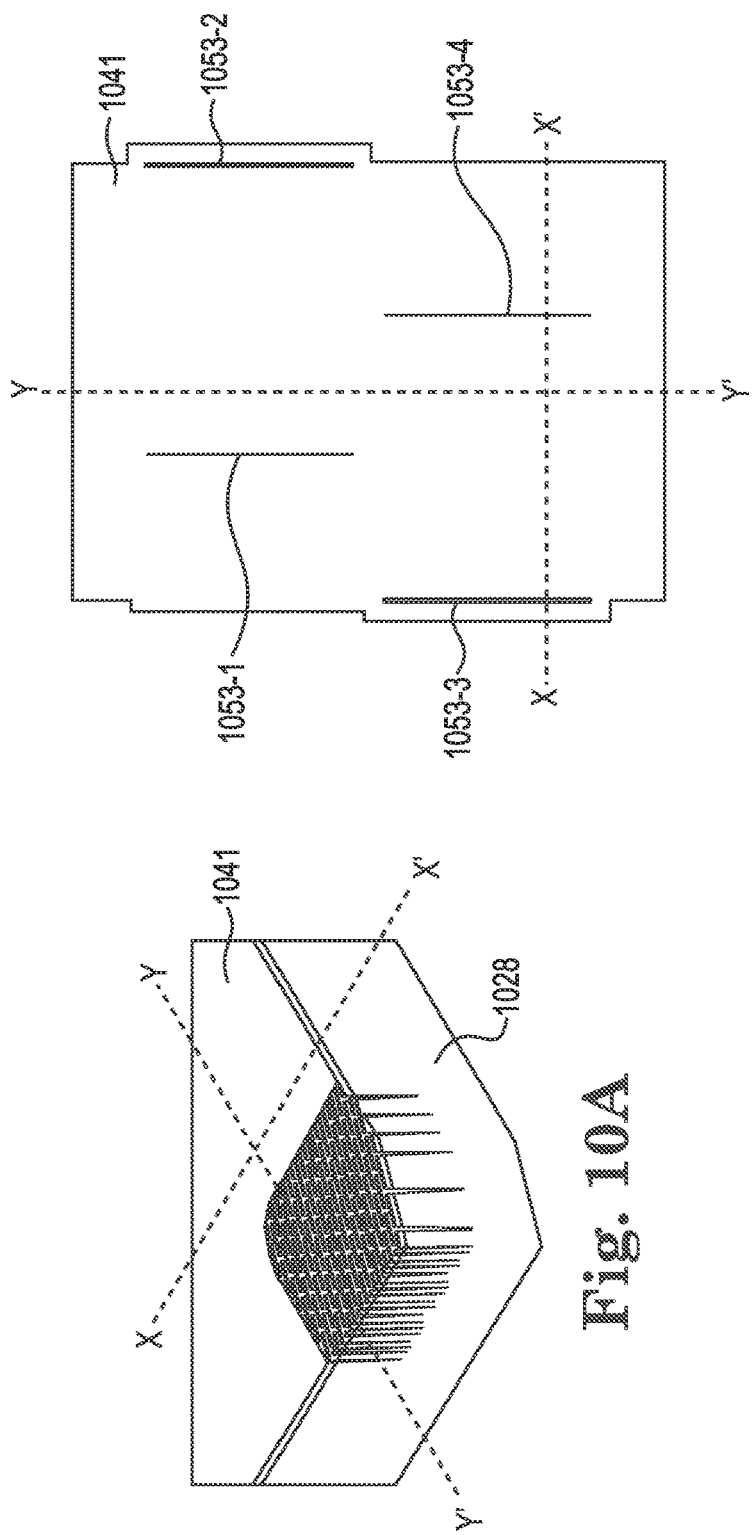
Fig. 10A
Fig. 10B
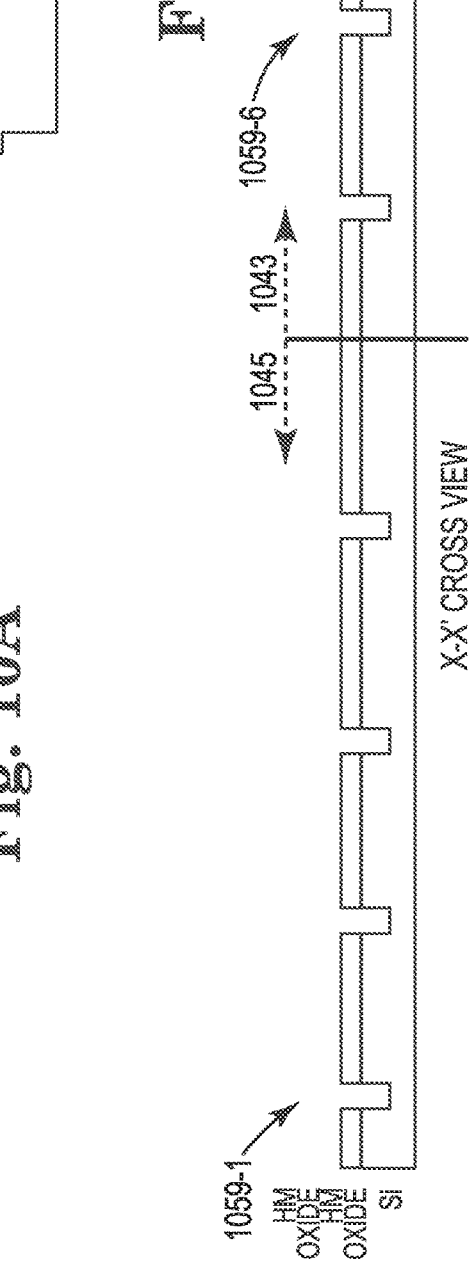
Fig. 10C

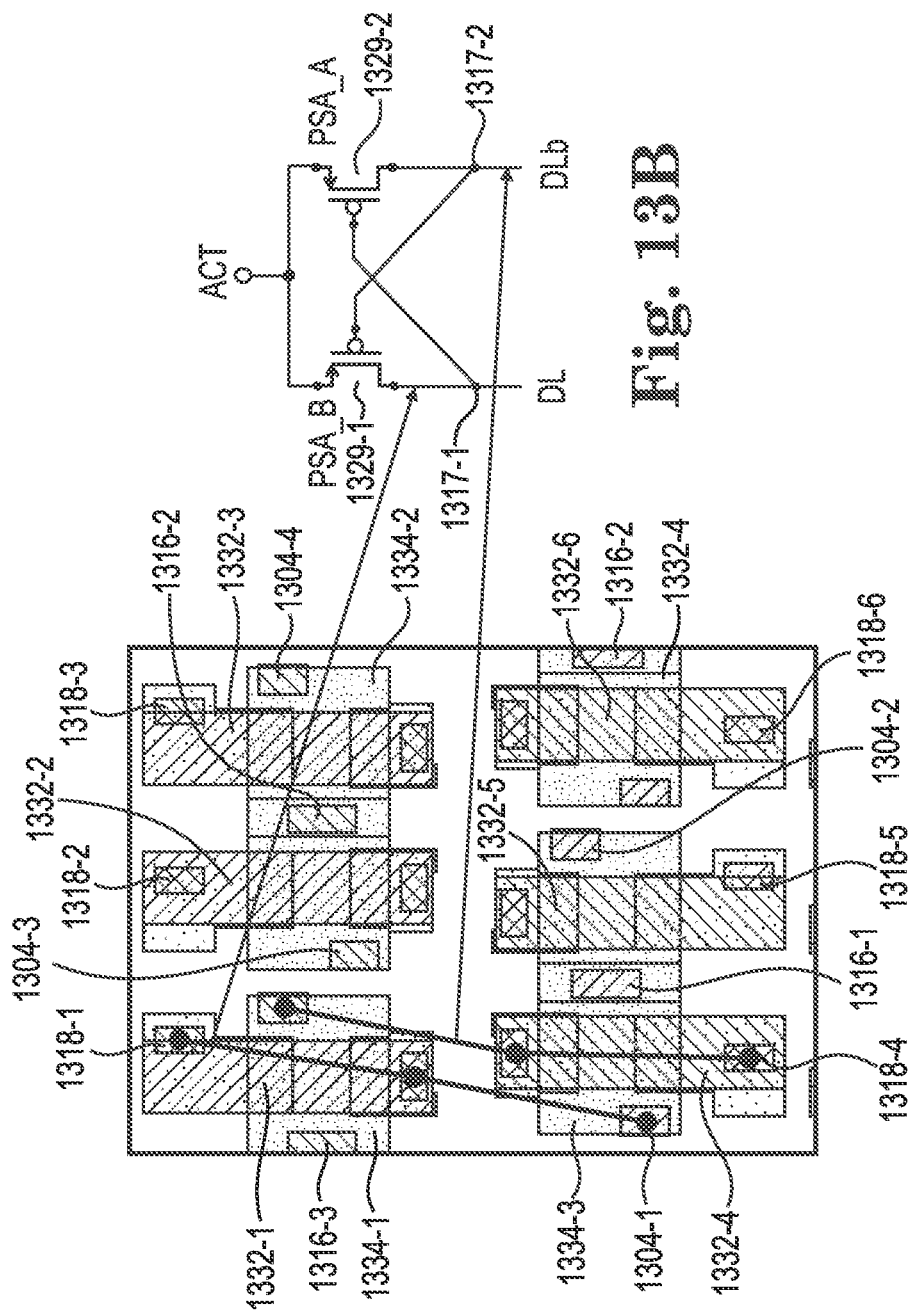

ARRAY AND PERIPHERAL AREA MASKING

TECHNICAL FIELD

The present disclosure relates generally to semiconductor memory and methods, and more particularly, to apparatuses and methods for array and peripheral area masking.

BACKGROUND

Memory devices are typically provided as internal, semiconductor, integrated circuits in computers or other electronic systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, and resistance variable memory such as phase change random access memory (PCRAM), resistive random access memory (RRAM), and magnetoresistive random access memory (MRAM), such as spin torque transfer random access memory (STT RAM), among others.

Electronic systems often include a number of processing resources (e.g., one or more processors), which may retrieve and execute instructions. A processor can comprise a number of functional units (e.g., herein referred to as functional unit circuitry such as arithmetic logic unit (ALU) circuitry, floating point unit (FPU) circuitry, and/or a combinatorial logic block, for example, which can execute instructions to perform logical operations such as AND, OR, NOT, NAND, NOR, and XOR logical operations on data (e.g., one or more operands).

BRIEF DESCRIPTION OF THE DRAWINGS

FIGS. 2A-2B each illustrate an example of memory components in accordance with a number of embodiments of the present disclosure.

FIGS. 3A-3C illustrate an example method, at a stage of a semiconductor fabrication process, for array and peripheral area masking in accordance with a number of embodiments of the present disclosure.

FIGS. 5A-5C illustrate an example method, at another stage of a semiconductor fabrication process, for array and peripheral area masking in accordance with a number of embodiments of the present disclosure.

FIGS. 6A-6C illustrate an example method, at another stage of a semiconductor fabrication process, for array and peripheral area masking in accordance with a number of embodiments of the present disclosure.

FIGS. 7A-7C illustrate an example method, at another stage of a semiconductor fabrication process, for array and peripheral area masking in accordance with a number of embodiments of the present disclosure.

FIGS. 10A-10C illustrate an example method, at another stage of a semiconductor fabrication process, for array and peripheral area masking in accordance with a number of embodiments of the present disclosure.

FIGS. 13A-13B illustrate a cross-coupled latch in accordance with a number of embodiments of the present disclosure.

DETAILED DESCRIPTION

Figure 1:
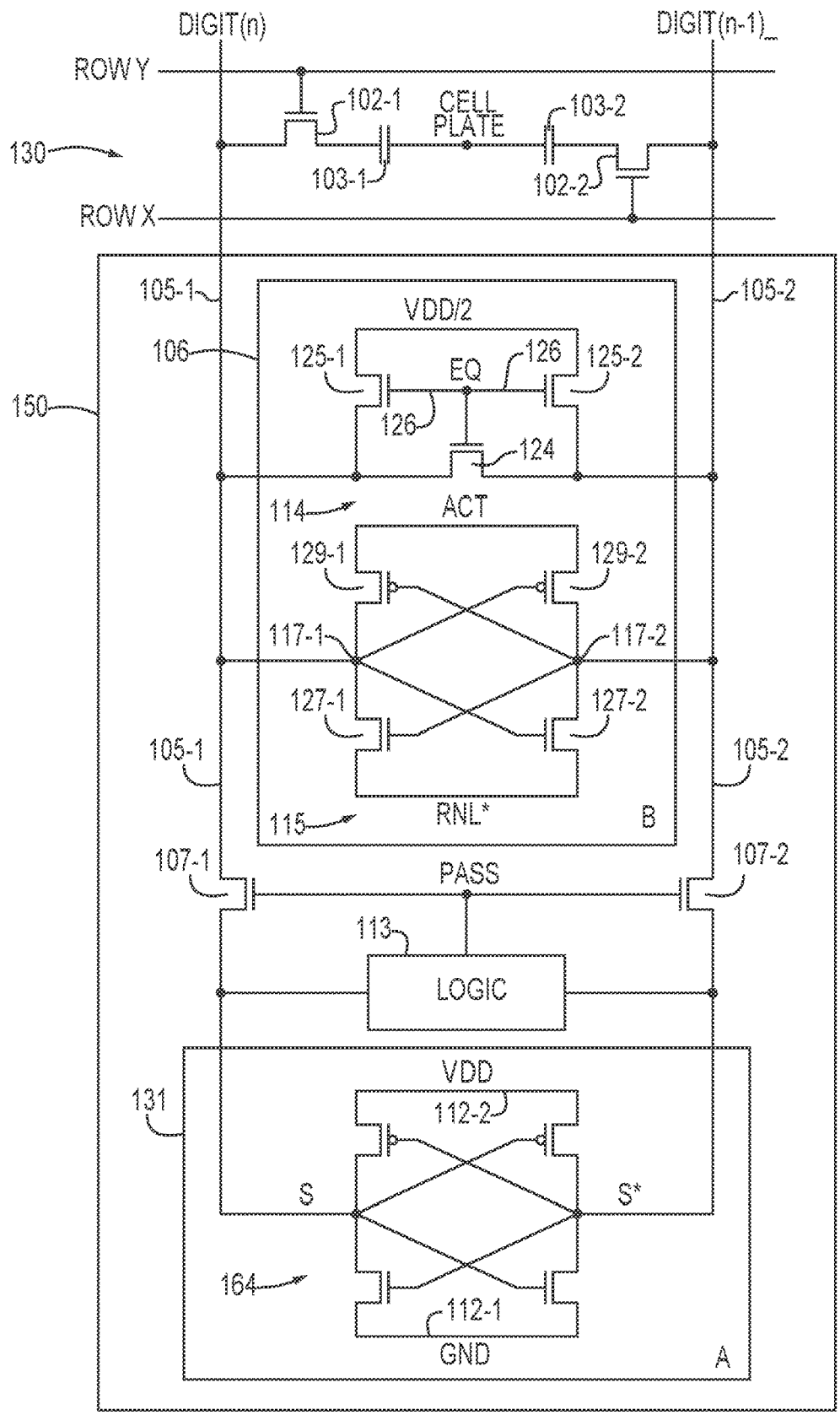
FIG. 1 is a schematic diagram illustrating sensing circuitry to a memory device in accordance with a number of embodiments of the present disclosure.

The present disclosure includes apparatuses and methods related to array and peripheral area masking. In a number of embodiments, an example method comprises concurrently forming an array active area mask in an array active area and a peripheral component active area. The method further comprises concurrently forming etch stop spacers using the array active area mask in the array active area and the peripheral component active area. The method further comprises forming a peripheral component active area mask in the peripheral component active area. The method further comprises etching a portion of the peripheral component active area to open peripheral component conductive contact vias using the peripheral component active area mask together with the formed etch stop spacers to reduce over-etch of an opening to a device well while increasing surface area opening to a peripheral component conductive contact. For example, openings may be created within the materials of the semiconductor using an array active area mask and a peripheral component active area mask. Etch stop spacers may be filled into the openings, creating a barrier against over-etching into the device well when creating peripheral component conductive contact vias. The vias have an increased surface area for the opening to the device well due to etch stop spacers and as such, the surface area for a sense amplifier's landing margin may be increased.

As design rules shrink and sense amplifiers, arrays and nodes are formed in smaller spaces, it can be become hard to achieve well-defined boundaries for the sense amplifiers and arrays. For instance, error margins can decrease and as a result shorts can occur, which leads to a decrease in effective electrical connection. Efforts to land local interface contact (licon) and to make conductive landing shrinks and there is an increase in missed licon landing.

Embodiments of the present disclosure address the above by concurrently forming multiple masks in the array active area and the peripheral component active area, and place etch stop spacers in areas to create well-defined boundaries for the sense amplifier. Etching away the masks in locations uncovered by the etch stop spacers reduces over-etch opening to a device while increasing surface area for the opening to the device well for a landing margin. Embodiments of the present disclosure offer effective electric connections even with smaller design rules and yet can still provide an increase in a sense amplifier's sensing margin. Further, embodiments herein provide the ability to land local interface contact (licon) which leads to an increase in source/drain conductivity and can provide a decrease in source/drain resistance without additional processes, among other benefits.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

As used herein, the designators "N," "X," "Y," etc., particularly with respect to reference numerals in the drawings, indicates that a number of the particular feature so designated can be included. As used herein, "a number of" a particular thing can refer to one or more of such things (e.g., a number of memory arrays can refer to one or more memory arrays).

The figures herein follow a numbering convention in which the first digit or digits correspond to the drawing figure number and the remaining digits identify an element or component in the drawing. Similar elements or components between different figures may be identified by the use of similar digits. For example, 204 may reference element "04" in FIG. 2 and a similar element may be referenced as 310 in FIG. 3. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention, and should not be taken in a limiting sense.

FIG. 1 is a schematic diagram illustrating sensing circuitry 150 in accordance with a number of embodiments of the present disclosure. A memory cell comprises a storage element (e.g., capacitor) and an access device (e.g., transistor). For instance, a first memory cell comprises transistor 102-1 and capacitor 103-1, and a second memory cell comprises transistor 102-2 and capacitor 103-2, etc. In this example, the memory array 130 is a DRAM array of 1T1C (one transistor one capacitor) memory cells. In a number of embodiments, the memory cells may be destructive read memory cells (e.g., reading the data stored in the cell destroys the data such that the data originally stored in the cell is refreshed after being read).

The cells of the memory array 130 can be arranged in rows coupled by word lines 104-X (Row X), 104-Y (Row Y), etc., and columns coupled by pairs of complementary sense lines (e.g., data lines DIGIT(n−1)/DIGIT(n−1)_, DIGIT(n)/DIGIT(n)_, DIGIT(n+1)/DIGIT(n+1)_). The individual sense lines corresponding to each pair of complementary sense lines can also be referred to as data lines 105-1 (D) and 105-2 (D_) respectively. Although only one pair of complementary data lines are shown in FIG. 1, embodiments of the present disclosure are not so limited, and an array of memory cells can include additional columns of memory cells and/or data lines (e.g., 4,096, 8,192, 16,384, etc.).

Memory cells can be coupled to different data lines and/or word lines. For example, a first source/drain region of a transistor 102-1 can be coupled to data line 105-1 (D), a second source/drain region of transistor 102-1 can be coupled to capacitor 103-1, and a gate of a transistor 102-1 can be coupled to word line 104-X. A first source/drain region of a transistor 102-2 can be coupled to data line 105-2 (D_), a second source/drain region of transistor 102-2 can be coupled to capacitor 103-2, and a gate of a transistor 102-2 can be coupled to word line 104-Y. The cell plate, as shown in FIG. 1, can be coupled to each of capacitors 103-1 and 103-2. The cell plate can be a common node to which a reference voltage (e.g., ground) can be applied in various memory array configurations.

The memory array 130 is coupled to sensing circuitry 150 in accordance with a number of embodiments of the present disclosure. In this example, the sensing circuitry 150 comprises a first cross-coupled latch (e.g., a sense amplifier) 106 and a second cross-coupled latch (e.g., as an example, a compute component) 131 corresponding to respective columns of memory cells (e.g., coupled to respective pairs of complementary data lines). The first cross-coupled latch (e.g., sense amplifier) 106 can be coupled to the pair of complementary sense lines 105-1 and 105-2. The second cross-coupled latch (e.g., compute component) 131 can be coupled to the sense amplifier 106 via pass gates 107-1 and 107-2. The gates of the pass gates 107-1 and 107-2 can be coupled to logical operation selection logic 113.

The logical operation selection logic 113 can be configured to include pass gate logic for controlling pass gates that couple the pair of complementary sense lines un-transposed between the sense amplifier 106 and the compute component 131 (as shown in FIG. 1) and/or swap gate logic for controlling swap gates that couple the pair of complementary sense lines transposed between the sense amplifier 106 and the compute component 131. The logical operation selection logic 113 can also be coupled to the pair of complementary sense lines 105-1 and 105-2. The logical operation selection logic 113 can be configured to control continuity of pass gates 107-1 and 107-2 based on a selected logical operation, as described in detail below for various configurations of the logical operation selection logic 413.

The sense amplifier 106 can be operated to determine a data value (e.g., logic state) stored in a selected memory cell. The sense amplifier 106 can comprise a cross coupled latch, which can be referred to herein as a primary latch. In the example illustrated in FIG. 1, the circuitry corresponding to sense amplifier 106 comprises a latch 115 including four transistors coupled to a pair of complementary data lines D 105-1 and D_ 105-2. However, embodiments are not limited to this example. The latch 115 can be a cross coupled latch (e.g., gates of a pair of transistors, such as n-channel transistors (e.g., NMOS transistors) 127-1 and 127-2 are cross coupled with the gates of another pair of transistors, such as p-channel transistors (e.g., PMOS transistors) 129-1 and 129-2). The cross coupled latch 115 comprising transistors 127-1, 127-2, 129-1, and 129-2 can be referred to as a primary latch.

In operation, when a memory cell is being sensed (e.g., read), the voltage on one of the data lines 105-1 (D) or 105-2 (D_) will be slightly greater than the voltage on the other one of data lines 105-1 (D) or 105-2 (D_). An ACT signal and the RNL* signal can be driven low to enable (e.g., fire) the sense amplifier 106. The data lines 105-1 (D) or 105-2 (D_) having the lower voltage will turn on one of the PMOS transistor 129-1 or 129-2 to a greater extent than the other of PMOS transistor 129-1 or 129-2, thereby driving high the data line 105-1 (D) or 105-2 (D_) having the higher voltage to a greater extent than the other data line 105-1 (D) or 105-2 (D_) is driven high.

Similarly, the data line 105-1 (D) or 105-2 (D_) having the higher voltage will turn on one of the NMOS transistors 127-1 or 127-2 to a greater extent than the other of the NMOS transistors 127-1 or 127-2, thereby driving low the data line 105-1 (D) or 105-2 (D_) having the lower voltage to a greater extent than the other data line 105-1 (D) or 105-2 (D_) is driven low. As a result, after a short delay, the data line 105-1 (D) or 105-2 (D_) having the slightly greater voltage is driven to the voltage of the supply voltage $V_{CC}$ through source transistor 111, and the other data line 105-1 (D) or 105-2 (D_) is driven to the voltage of the reference voltage (e.g., ground) through the sink transistor 113. Therefore, the cross coupled NMOS transistors 127-1 and 127-2 and PMOS transistors 129-1 and 129-2 serve as a sense amplifier pair, which amplify the differential voltage on the data lines 105-1 (D) and 105-2 (D_) and operate to latch a data value sensed from the selected memory cell. As used herein, the cross coupled latch of sense amplifier 106 may be referred to as a primary latch 115.

Embodiments are not limited to the sense amplifier 106 configuration illustrated in FIG. 1. As an example, the sense amplifier 106 can be current-mode sense amplifier and/or single-ended sense amplifier (e.g., sense amplifier coupled to one data line). Also, embodiments of the present disclosure are not limited to a folded data line architecture such as that shown in FIG. 1.

The sense amplifier 106 can, in conjunction with the compute component 131, be operated to perform various logical operations using data from an array as input. In a number of embodiments, the result of a logical operation can be stored back to the array without transferring the data via a data line address access (e.g., without firing a column decode signal such that data is transferred to circuitry external from the array and sensing circuitry via local I/O lines). As such, a number of embodiments of the present disclosure can enable performing logical operations and compute functions associated therewith using less power than various previous approaches. Additionally, since a number of embodiments eliminate the need to transfer data across I/O lines in order to perform compute functions (e.g., between memory and discrete processor), a number of embodiments can enable an increased parallel processing capability as compared to previous approaches.

The sense amplifier 106 can further include equilibration circuitry 114, which can be configured to equilibrate the data lines 105-1 (D) and 105-2 (D_). In this example, the equilibration circuitry 114 comprises a transistor 124 coupled between data lines 105-1 (D) and 105-2 (D_). The equilibration circuitry 114 also comprises transistors 125-1 and 125-2 each having a first source/drain region coupled to an equilibration voltage (e.g., $V_{DD}/2$), where $V_{DD}$ is a supply voltage associated with the array. A second source/drain region of transistor 125-1 can be coupled data line 105-1 (D) and a second source/drain region of transistor 125-2 can be coupled data line 105-2 (D_). Gates of transistors 124, 125-1 and 125-2 can be coupled together, and to an equilibration (EQ) control signal line 126. As such, activating EQ enables the transistors 124, 125-1, and 125-2, which effectively shorts data lines 105-1 (D) and 105-2 (D_) together and to an equilibration voltage (e.g., $V_{CC}/2$).

Although FIG. 1 shows sense amplifier 106 comprising the equilibration circuitry 114, embodiments are not so limited, and the equilibration circuitry 114 may be implemented discretely from the sense amplifier 106, implemented in a different configuration than that shown in FIG. 1, or not implemented at all.

As shown in FIG. 1, the compute component 131 can also comprise a latch, which can be referred to herein as a secondary latch 164. The secondary latch 164 can be configured and operated in a manner similar to that described above with respect to the primary latch 115, with the exception that the pair of cross coupled p-channel transistors (e.g., PMOS transistors) comprising the secondary latch can have their respective sources coupled to a supply voltage (e.g., $V_{DD}$), and the pair of cross coupled n-channel transistors (e.g., NMOS transistors) of the secondary latch can have their respective sources selectively coupled to a reference voltage (e.g., ground), such that the secondary latch is continuously enabled. The configuration of the compute component is not limited to that shown in FIG. 1 at 131, and various other embodiments are described further below.

FIG. 2A illustrates an example of memory components in accordance with a number of embodiments of the present disclosure. The memory component can include transistors (e.g., a first transistor 232-1, a second transistor 232-2, a third transistor 232-3, a fourth transistor 232-4, a fifth transistor 232-5, and a sixth transistor 232-6, hereinafter collectively referred to as transistors 232) that may be analogous or similar to transistors 102 of FIG. 1. The memory components can include source/drain regions (e.g., a first source/drain region 234-1, a second source/drain region 234-2, a third source/drain region 234-3, a fourth source/drain region 234-4, a fifth source/drain region 234-5, and a sixth source/drain region 234-6 hereinafter collectively referred to as source/drain region 234) that may be analogous or similar to source/drain region 102/105 of FIG. 1. The gates 218 (e.g., a first gate 218-1, a second gate 218-2, a third gate 218-3, a fourth gate 218-4, a fifth gate 218-5, and a sixth gate 218-6 hereinafter collectively referred to as gates 218) may each be analogous or similar to gate 107 of FIG. 1.

Further, the memory cells as illustrated can include a first drain 204-1, a second 204-2, a third drain 204-3, and a fourth drain 204-4 (hereinafter collectively referred to as drains 204), a first source 216-1, a second source 216-2, and a third source 216-3 (hereinafter collectively referred to as source 216). Metal oxide semiconductor field effect transistors (MOSFETs) 232 have small widths that can decrease the sensing margin of the sensing circuitry due to shrinking landing margins. Decreasing licon can lead to decreased source/drain conductivity and well leakage as shown at drain 204. FIG. 2A illustrates the effect of inappropriate licon landing. The drain 204-2 is unable to be formed properly within source/drain region 234-3 (as indicated by "A" in FIG. 2A). The circle 260 illustrates where the licon contact misses a portion of drain 204-2.

FIG. 2B illustrates an example of memory components in accordance with a number of embodiments of the present disclosure. As design rules shrink, error margins decrease, and shorts can occur leading to a decrease in effective electrical connection. The amount of space and/or area to land local interface contact (licon) 233 to the conductive landing pad, such as P+ drain 204, shrinks. As such, licon 233 can miss its landing contact of the P+ drain 204 on the transistor well 262. The shrinking licon 233 can lead to leakage of the transistors. FIG. 2B highlights where the licon contact 233 missed the transistor.

FIG. 3A illustrates an example method, at another stage of a semiconductor fabrication process, for array and peripheral area in accordance with a number of embodiments of the present disclosure. This view shows a portion of the array of memory cells and their periphery. The memory cell can consist of repeating iterations of a silicon substrate layer 328, oxide layers (e.g., first oxide layer 324-1 and second oxide layer 324-2, hereinafter collectively referred to as oxide layer 324), hard mask layers (e.g., first hard mask layer 322-1 and second hard mask layer 322-2, hereinafter collectively referred to as hard mask layer 322), and other layers of materials for semiconductor structure formation 338-1 and 338-N.

As illustrated in FIG. 3A, a photoresist material may be formed concurrently formed in an array active area and a peripheral component active area. Photolithographic techniques may be used to pattern the photoresist material into a photolithographic mask. An array active area mask 310 may be formed by patterning the photoresist material. The array active area mask 310 may be used to form a plurality of openings in an array active area and a peripheral component active area. The array active area mask 310 may be concurrently formed in the array active area and the peripheral component active area. The array active area may refer to an area where the array of memory cells (illustrated as memory array 130 in FIG. 1) may subsequently be formed. The peripheral component active area may refer to an area where the sensing circuitry (illustrated as sensing circuitry 150 in FIG. 1) including the sense amplifiers may subsequently be formed. The array active area mask 310 may be formed on a first oxide layer 324-1.

FIG. 3B illustrates an example method, at another stage of a semiconductor fabrication process, for array and peripheral area masking in accordance with a number of embodiments of the present disclosure. FIG. 3B illustrates a top down view of memory components, at a particular point in time, according to one or more embodiments. The layers that form the memory cells below the illustrated memory components may not be visible from this view. The transistors 332 (or individually referred to as a first transistor 332-1, a second transistor 332-2, a third transistor 332-3, a fourth transistor 332-4, a fifth transistor 332-5, and a sixth transistor 332-6) may be analogous or similar to transistors 102 of FIG. 1 and transistors 232 of FIG. 2A. The source/drain regions 334 (or individually referred to as a first source/drain region 334-1, a second source/drain region 334-2, a third source/drain region 334-3, a fourth source/drain region 334-4, a fifth source/drain region 334-5, and a sixth source/drain region 334-6) may be analogous or similar to source/drain region 102/105 of FIG. 1 and source/drain region 234 of FIG. 2A. The gates 318 (or individually referred to as a first gate 318-1, a second gate 318-2, a third gate 318-3, and a fourth gate 318-4) may be analogous or similar to gate 107 of FIG. 1 and gates 218 of FIG. 2A. The source 316 (or individually referred to as a first source 316-1, a second source 316-2, and a third source 316-3) may be analogous or similar to source 216 of FIG. 2A. The drains 304 (or a first drain 304-1, a second 304-2, a third drain 304-3, and a fourth drain 304-4) may be analogous or similar to source 204 of FIG. 2A.

The array active area mask 310 may be illustrated as the thick lines formed over the memory components. This view illustrates the array active area mask 310 formed over the peripheral component active area. The array active area mask 310 may be placed over the memory components for forming and etching spacers where needed. For example, the array active area mask 310 may be placed above locations with potential licon margin issues (such as illustrated in drain 204 in FIG. 2A and licon 233 in FIG. 2B) may arise.

FIG. 3C illustrates an example method, at another stage of a semiconductor fabrication process, for array and peripheral area masking in accordance with a number of embodiments of the present disclosure. This view shows a cross-section of the array of memory cells and its periphery. The X-X' cross view and the Y-Y' cross view may refer to the cross-sections delineated in FIGS. 3A and 3B. Arrow 345 indicates the portion of the array active area and arrow 343 indicates the portion of the peripheral component active area. The Y-Y' cross view also represents the cross-section of the array active area. As illustrated here, memory cells may be located within or near a silicon substrate layer 328, and below multiple oxide layers 324, and below multiple hard mask layers 322.

The view illustrated in FIG. 3C shows the array active area mask 310 formed using photolithographic techniques. For example, in the direction indicated by arrow 345, the array active area mask 310 may be placed in locations where etch stop spacer pillars will be formed to create openings for etch stop spacers.

Figures 4A, 4B, 4C:
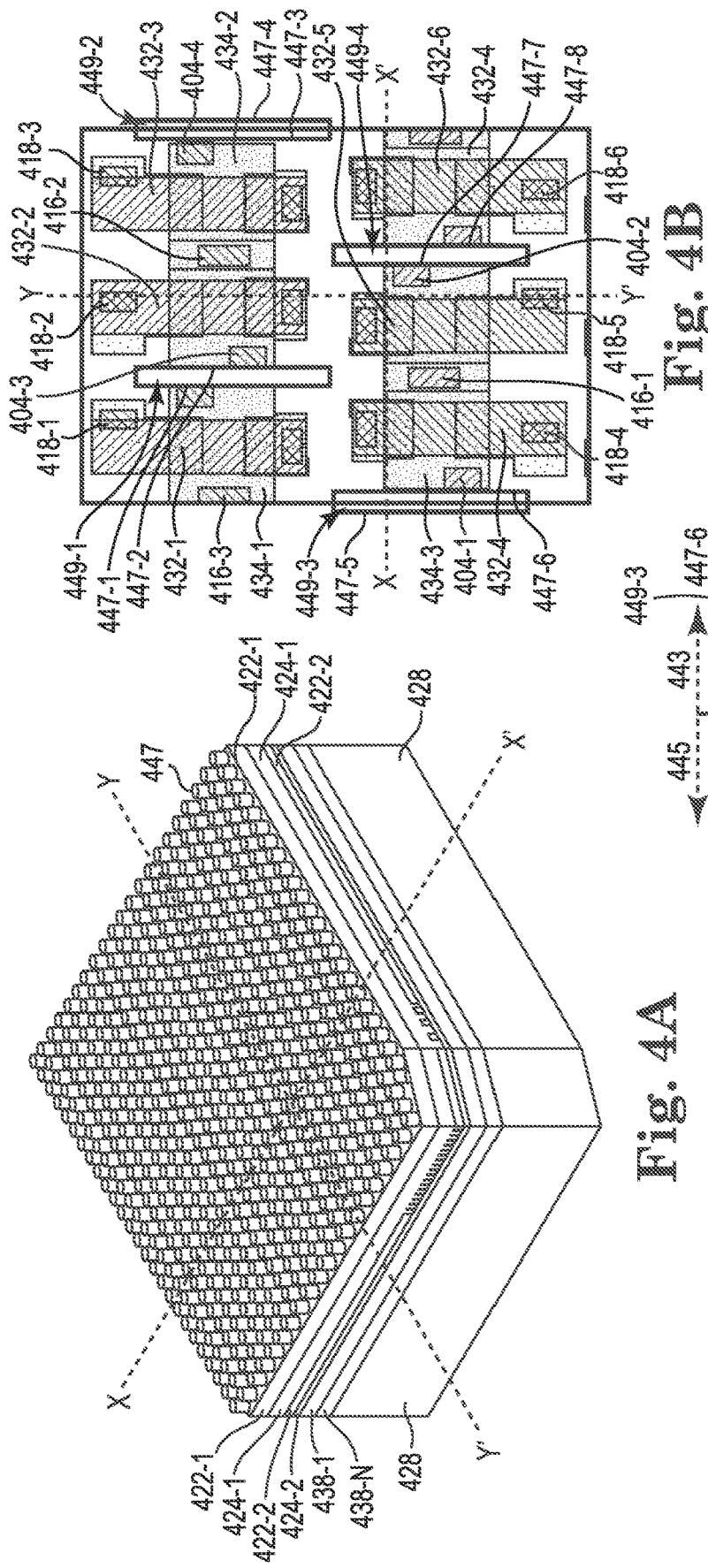
FIGS. 4A-4C illustrate an example method, at another stage of a semiconductor fabrication process, for array and peripheral area masking in accordance with a number of embodiments of the present disclosure.

FIG. 4A illustrates an example method, at another stage of a semiconductor fabrication process, for array and peripheral area masking in accordance with a number of embodiments of the present disclosure. This view shows a portion of the array of memory cells and its periphery. The memory cell can be formed within a silicon substrate layer 428 which is analogous or similar to silicon substrate layer 328 of FIGS. 3A and 3C, and below multiple oxide layers 424, which is analogous or similar to multiple oxide layers 324 of FIGS. 3A and 3C, and below multiple hard mask layers 422, which is analogous or similar to multiple hard mask layers 322 of FIGS. 3A and 3C.

The array active area mask may be patterned into etch stop spacer pillars using photolithographic techniques. A first etch stop spacer pillar (e.g., spacer pillar 447-1, spacer pillar 447-2, spacer pillar 447-3, spacer pillar 447-4, spacer pillar 447-5, spacer pillar 447-6, spacer pillar 447-7, and spacer pillar 447-8 hereinafter collectively referred to as first etch stop spacer pillars 447) may be concurrently formed in an array active area and a peripheral component active area using the array active area mask. The first etch stop spacer pillar 447 may be formed from an oxide material. The first etch stop spacer pillar 447 may be a dry strip. A dry strip process may be carried out using a dry etch plasma. The dry etch strip chemistry may comprise of a mixture of nitrogen gas ($N_2$) and hydrogen gas ($H_2$). The first etch stop spacer pillar 447 may be formed on the peripheral component active area after removing the photoresist mask of the array active area mask. The first etch stop spacer pillar 447 may be formed over the array active area mask.

FIG. 4B illustrates an example method, at another stage of a semiconductor fabrication process, for array and peripheral area masking in accordance with a number of embodiments of the present disclosure. FIG. 4B illustrates a top down view of the sensing circuitry, at a particular point in time, according to one or more embodiments. The layers that form a portion of the memory cell (discrete components e.g., active transistors 432) may not be visible from this view. The transistors 432 may be analogous or similar to transistors 102 of FIG. 1 and transistors 232 and 332 of FIGS. 2A and 3B respectively. The source/drain regions 434 may be analogous or similar to source/drain region 102/105 of FIG. 1 and source/drain region 234 and 334 of FIGS. 2A and 3B respectively. The gates 418 may be analogous or similar to gate 107 of FIG. 1 and gates 218 and 318 of FIGS. 2A and 3B respectively. The source 416 may be analogous or similar to source 216 and source 316 of FIGS. 2A and 3B respectively. The drains 404 may be analogous or similar to drain 204 and drain 304 of FIGS. 2A and 3B respectively.

The first etch stop spacer pillars 447 may be formed on the peripheral component active area after removing the photoresist mask of the array active area mask. First etch stop spacer pillar pair, for example spacer pillar 447-7 and spacer pillar 447-8, may comprise the initial oxide deposition for the etch stop spacer pillar.

FIG. 4C illustrates an example method, at another stage of a semiconductor fabrication process, for array and peripheral area masking in accordance with a number of embodiments of the present disclosure. This view shows a cross-section of the array of memory cells and its periphery. The X-X' cross view and the Y-Y' cross view may refer to the cross-sections delineated in FIGS. 4A and 4B. Arrow 445 represents the cross-section of the array active area and arrow 443 represents the cross-section of the peripheral component active area. The Y-Y' cross view also represents the cross-section of the array active area. The memory cell can be formed within or near a silicon substrate layer 428 which is analogous or similar to silicon substrate layer 328 of FIGS. 3A and 3C, and below multiple oxide layers 424 which is analogous or similar to multiple oxide layers 324 of FIGS. 3A and 3C, and below multiple hard mask layers 422 which is analogous or similar to multiple hard mask layers 322 of FIGS. 3A and 3C.

This view illustrates the placement of the first etch stop spacer pillar 447 on the materials of the semiconductor structure. The first etch stop spacers pillar 447 may be created by the array active area mask using photolithographic techniques. A space 449 may exist between a pair of the first etch stop spacer pillars. For example, pair of spacer pillars 447-5 and 447-6 may have a space 449-3 between the pair.

FIG. 5A illustrates an example method, at another stage of a semiconductor fabrication process, for array and peripheral area masking in accordance with a number of embodiments of the present disclosure. This view shows a portion of the array of memory cells and its periphery. The silicon substrate layer 528 may be analogous or similar to silicon substrate layer 328 and 428 of FIGS. 3 and 4 respectively. Multiple oxide layers 524 may be analogous or similar to multiple oxide layers 324 and 424 of FIGS. 3A and 3C and 4A and 4C. Multiple hard mask layers 522 may be analogous or similar to multiple hard mask layers 322 and 422 of FIGS. 3 and 4.

Second etch stop spacer pillars 553 may be concurrently formed in an array active area and a peripheral component active area using the array active area mask 510. The second etch stop spacer pillars 553 may be formed over the first etch stop spacer pillar. The second etch stop spacer pillars 553 may be formed from an oxide material. The second etch stop spacer pillars 553 may also be a dry strip. A dry strip process may be carried out using a dry etch plasma. The dry etch strip chemistry may comprise of a mixture of nitrogen gas ($N_2$) and hydrogen gas ($H_2$). In some embodiments, the first etch stop spacer pillars and the second etch stop spacer pillars 553 may be combined to form a single etch stop spacer pillar. For example, the first etch stop spacer pillars and the second etch stop spacer pillars 553 may be deposited onto the array active area and a peripheral component active area concurrently.

FIG. 5B illustrates an example method, at another stage of a semiconductor fabrication process, for array and peripheral area masking in accordance with a number of embodiments of the present disclosure. FIG. 5B illustrates a top down view of sensing circuitry, at a particular point in time, according to one or more embodiments. The layers that form the memory cell may not be visible from this view. The transistors 532 may be analogous or similar to transistors 102 of FIG. 1 and transistors 232, 332, and 432 of FIGS. 2A, 3B, and 4B respectively. The source/drain regions 534 may be analogous or similar to source/drain region 102/105 of FIG. 1 and source/drain region 234, 334, and 434 of FIGS. 2A, 3B, and 4B respectively. The gates 518 may be analogous or similar to gate 107 of FIG. 1 and gates 218, 318, and 418 of FIGS. 2A, 3B, and 4B respectively. The source 516 may be analogous or similar to source 216, 316, and 416 of FIGS. 2A, 3B, and 4B respectively. The drains 504 may be analogous or similar to source 204, 304, and 404 of FIGS. 2A, 3B, and 4B respectively.

The second etch stop spacer pillars (e.g., spacer pillar 553-1, spacer pillar 553-2, spacer pillar 553-3, spacer pillar 553-4, spacer pillar 553-5, spacer pillar 553-6, spacer pillar 553-7, and spacer pillar 553-8 hereinafter collectively referred to as second etch stop spacer pillars 553) may be deposited on the first etch stop spacer pillars over the peripheral component active area. The second etch stop spacer pillars 553 may encompass the first etch stop spacer pillars and only the second etch stop spacer pillars 553 may be viewed in this view.

FIG. 5C illustrates an example method, at another stage of a semiconductor fabrication process, for array and peripheral area masking in accordance with a number of embodiments of the present disclosure. This view shows a cross-section of the array of memory cells and its periphery. The X-X' cross view and the Y-Y' cross view may refer to the cross-sections delineated in FIGS. 5A and 5B. Arrow 545 represents the cross-section of the array active area and arrow 543 represents the cross-section of the peripheral component active area. The Y-Y' cross view also represents the cross-section of the array active area. The silicon substrate layer 528 may be analogous or similar to silicon substrate layer 328 and 428 of FIGS. 3 and 4 respectively. Multiple oxide layers 524 may be analogous or similar to multiple oxide layers 324 and 424 of FIGS. 3A and 3C and 4A and 4C. Multiple hard mask layers 522 may be analogous or similar to multiple hard mask layers 322 and 422 of FIGS. 3 and 4.

This view illustrates the placement of the second etch stop spacer pillars 553. Second etch stop spacer pillars 553 may comprise a subsequent oxide deposition for the etch stop spacer pillar. As such, the second etch stop spacer pillars 553 may be formed over the first etch stop spacer pillar 547. For example, the first etch stop spacer pillar 547 may be seen in the spaces within the second etch stop spacer pillar 553, as illustrated. The second etch stop spacer pillar 553 formed over the first etch stop spacer pillar 547 may be formed above the materials of the semiconductor structure in the peripheral component active area and the array active area mask. A space 549 may exist between a pair of the second etch stop spacer pillars. For example, pair of spacer pillars 553-3 and 553-4 may have a space 549-2 between the pair.

FIG. 6A illustrates an example method, at another stage of a semiconductor fabrication process, for array and peripheral area masking in accordance with a number of embodiments of the present disclosure. This view shows a portion of the array of memory cells and its periphery. The silicon substrate layer 628 may be analogous or similar to silicon substrate layer 328, 428, and 528 of FIGS. 3, 4, and 5 respectively. Multiple oxide layers 624 may be analogous or similar to multiple oxide layers 324, 424, and 524 of FIGS.

3A and 3C, 4A and 4C, and 5A and 5C. Multiple hard mask layers 622 may be analogous or similar to multiple hard mask layers 322, 422, and 522 of FIGS. 3A and 3C, 4A and 4C, and 5A and 5C.

An etchant process may begin in this step and the etch stop spacer pillars placed in previous processes may serve as protection for the materials of the semiconductor structure below. The etchant process may not be visible in this view. However, the second etch stop spacer pillar 653 may be seen above the materials of the semiconductor.

FIG. 6B illustrates an example method, at another stage of a semiconductor fabrication process, for array and peripheral area masking in accordance with a number of embodiments of the present disclosure. FIG. 6B illustrates a top down view of sensing circuitry, at a particular point in time, according to one or more embodiments. The layers that form the memory cell may not be visible from this view. The transistors 632 may be analogous or similar to transistors 102 of FIG. 1 and transistors 232, 332, 432, and 532 of FIGS. 2A, 3B, 4B, and 5B respectively. The source/drain regions 634 may be analogous or similar to source/drain region 102/105 of FIG. 1 and source/drain region 234, 334, 434, and 534 of FIGS. 2A, 3B, 4B, and 5B respectively. The gates 618 may be analogous or similar to gate 107 of FIG. 1 and gates 218, 318, 418, and 518 of FIGS. 2A, 3B, 4B, and 5B respectively. The source 616 may be analogous or similar to source 216, 316, 416, and 516 of FIGS. 2A, 3B, 4B, and 5B respectively. The drains 604 may be analogous or similar to source 204, 304, 404, and 504 of FIGS. 2A, 3B, 4B, and 5B respectively.

Second etch stop spacer pillars 653 and the space 649 between each pair of etch stop spacer pillars may still be viewed over the sensing circuitry. However, the etchant process may not be visible in this view over the sensing circuitry.

FIG. 6C illustrates an example method, at another stage of a semiconductor fabrication process, for array and peripheral area masking in accordance with a number of embodiments of the present disclosure. This view shows a cross-section of the array of memory cells and its periphery. The X-X' cross view and the Y-Y' cross view may refer to the cross-sections delineated in FIGS. 6A and 6B. Arrow 645 represents the cross-section of the array active area and arrow 643 represents the cross-section of the peripheral component active area. The Y-Y' cross view also represents the cross-section of the array active area. The silicon substrate layer 628 may be analogous or similar to silicon substrate layer 328, 428, and 528 of FIGS. 3A and 3C, 4A and 4C, and 5A and 5C respectively. Multiple oxide layers 624 may be analogous or similar to multiple oxide layers 324, 424, and 524 of FIGS. 3A and 3C, 4A and 4C, and 5A and 5C. Multiple hard mask layers 622 may be analogous or similar to multiple hard mask layers 322, 422, and 522 of FIGS. 3A and 3C, 4A and 4C, and 5A and 5C.

This view illustrates the etch of the first hard mask layer 622-1. An etchant may be flowed over the materials of the semiconductor structure. The etchant may etch away portions of the first hard mask layer 622-1 not protected by the first etch stop spacer pillars 647 and the second etch stop spacer pillars 653. The openings etched revealed by the etchant will become the opening for the etch stop spacer.

FIG. 7A illustrates an example method, at another stage of a semiconductor fabrication process, for array and peripheral area masking in accordance with a number of embodiments of the present disclosure. This view shows a portion of the array of memory cells and its periphery. The silicon substrate layer 728 may be analogous or similar to silicon substrate layer 328, 428, 528, and 628 of FIGS. 3, 4, 5, and 6 respectively. Multiple oxide layers 724 may be analogous or similar to multiple oxide layers 324, 424, 524, and 624 of FIGS. 3A and 3C, 4A and 4C, 5A and 5C, and 6A and 6C. Multiple hard mask layers 722 may be analogous or similar to multiple hard mask layers 322, 422, 522, and 622 of FIGS. 3A and 3C, 4A and 4C, 5A and 5C, and 6.

A peripheral component active area mask 736 may be formed in the peripheral component active area. In some embodiments, the peripheral component active area mask 736 may be formed only in the peripheral component active area, as illustrated in FIG. 7A. In other embodiments, the peripheral component active area mask 736 may be concurrently formed in the array active area and the peripheral component active area. The peripheral component active area mask 736 may be formed using photolithographic techniques to pattern a photolithographic mask. The peripheral component active area mask 736 may be formed on the second etch stop spacer pillar 753. The peripheral component active area mask 736 may be formed on the second etch stop spacer pillar 753 filled with the first etch stop spacer pillar (not illustrated in this figure).

FIG. 7B illustrates an example method, at another stage of a semiconductor fabrication process, for array and peripheral area masking in accordance with a number of embodiments of the present disclosure. FIG. 7B illustrates a top down view of sensing circuitry, at a particular point in time, according to one or more embodiments. The layers that form the memory cell may not be visible from this view. The transistors 732 may be analogous or similar to transistors 102 of FIG. 1 and transistors 232, 332, 432, 532, and 632 of FIGS. 2A, 3B, 4B, 5B, and 6B respectively. The source/drain regions 734 may be analogous or similar to source/drain region 102/105 of FIG. 1 and source/drain region 234, 334, 434, 534, and 634 of FIGS. 2A, 3B, 4B, 5B, and 6B respectively. The gates 718 may be analogous or similar to gate 107 of FIG. 1 and gates 218, 318, 418, 518, and 618 of FIGS. 2A, 3B, 4B, 5B, and 6B respectively. The source 716 may be analogous or similar to source 216, 316, 416, 516, and 616 of FIGS. 2A, 3B, 4B, 5B, and 6B respectively. The drains 704 may be analogous or similar to source 204, 304, 404, 504, and 604 of FIGS. 2A, 3B, 4B, 5B, and 6B respectively.

The peripheral component active area mask 736 may be illustrated as a thick line formed over the sensing circuitry. This view illustrates the peripheral component active area mask 736 formed over the peripheral component active area. This view also illustrates second etch stop spacer pillars 753 and the spaces 749 between each pair of etch stop spacer pillars.

FIG. 7C illustrates an example method, at another stage of a semiconductor fabrication process, for array and peripheral area masking in accordance with a number of embodiments of the present disclosure. This view shows a cross-section of the array of memory cells and its periphery. The X-X' cross view and the Y-Y' cross view may refer to the cross-sections delineated in FIGS. 7A and 7B. Arrow 745 represents the cross-section of the array active area and arrow 743 represents the cross-section of the peripheral component active area. The Y-Y' cross view also represents the cross-section of the array active area. The silicon substrate layer 728 may be analogous or similar to silicon substrate layer 328, 428, 528, and 628 of FIGS. 3A and 3C, 4A and 4C, 5A and 5C, and 6A and 6C respectively. Multiple oxide layers 724 may be analogous or similar to multiple oxide layers 324, 424, 524, and 624 of FIGS. 3A and 3C, 4A and 4C, 5A and 5C, and 6A and 6C. Multiple hard mask layers 722 may be analogous or similar to multiple hard mask layers 322, 422, 522, and 622 of FIGS. 3A and 3C, 4A and 4C, 5A and 5C, and 6A and 6C.

This view illustrates the peripheral component active area mask 736 over the materials of the semiconductor structure. The peripheral component active area mask 736 may flow through the opening created by the etchant (as described in FIG. 6C). For example, peripheral component active area mask 736 may flow through the opening between a pair of second etch stop spacer pillars to the first hard mask layer 722-1.

In this embodiment, the peripheral component active area mask 736 may only be deposited on the peripheral component active area. Therefore, the peripheral component active area mask 736 is only illustrated over the materials of the semiconductor structure in arrow 743. In an embodiment where the peripheral component active area mask 736 is deposited concurrently on the peripheral component active area and the array active area, the peripheral component active area mask 736 may be visible in both arrow 743 and arrow 745.

Figure 8A:
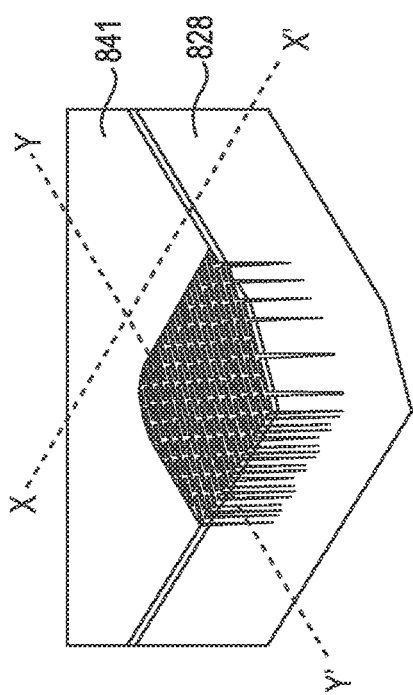
FIGS. 8A-8C illustrate an example method, at another stage of a semiconductor fabrication process, for array and peripheral area masking in accordance with a number of embodiments of the present disclosure.

FIG. 8A illustrates an example method, at another stage of a semiconductor fabrication process, for array and peripheral area masking in accordance with a number of embodiments of the present disclosure. This view shows a portion of the array of memory cells and its periphery. The substrate material 828 is analogous or similar to substrate material 328, 428, 528, 628 and 728 of FIGS. 3A and 3C, 4A and 4C, 5A and 5C, 6A and 6C, and 7A and 7C respectively.

FIG. 8A illustrates an etchant material 841 covering the semiconductor structure to remove the peripheral component active area mask. In the embodiment illustrated, the peripheral component active area mask may be etched away from a portion of the peripheral component active area, leaving the array active area uncovered by the etchant material 841. The peripheral component active area may be etched to create an opening to deposit etch stop spacers. The etchant material 841 may consist of a dry etch material. The dry etch may occur through a photo pattern and/or a plasma process.

Figure 8B:
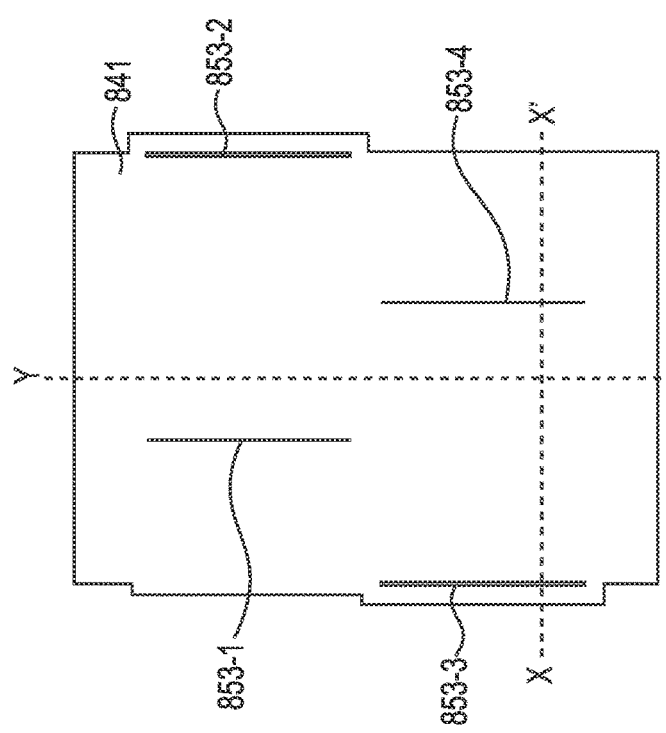

FIG. 8B illustrates an example method, at another stage of a semiconductor fabrication process, for array and peripheral area masking in accordance with a number of embodiments of the present disclosure. FIG. 8B illustrates a top down view of sensing circuitry, at a particular point in time, according to one or more embodiments. The layers that form the memory cell may not be visible from this view.

The dry etch material 841 may be viewed over the materials of the semiconductor structure below. The etchant material 841 may be deposited to create an opening to deposit etch stop spacers. The etchant material 841 may be deposited into the middle of the first etch stop spacer pillar and the second etch stop spacer pillars 853.

Figure 8C:
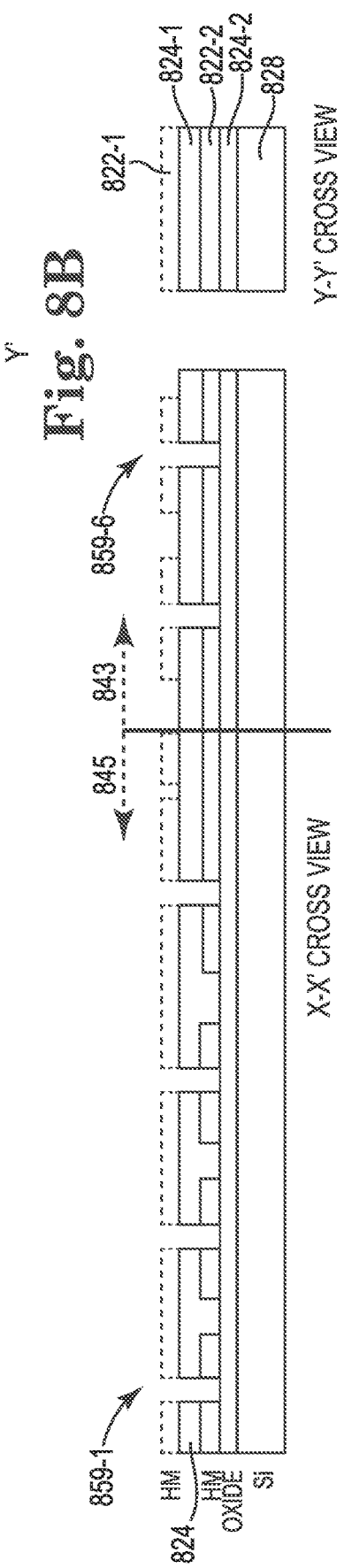

FIG. 8C illustrates an example method, at another stage of a semiconductor fabrication process, for array and peripheral area masking in accordance with a number of embodiments of the present disclosure. This view shows a cross-section of the array of memory cells and its periphery. The X-X' cross view and the Y-Y' cross view may refer to the cross-sections delineated in FIGS. 8A and 8B. Arrow 845 represents the cross-section of the array active area and arrow 843 represents the cross-section of the peripheral component active area. The Y-Y' cross view also represents the cross-section of the array active area. The silicon substrate layer 828 may be analogous or similar to silicon substrate layer 328, 428, 528, 628, and 728 of FIGS. 3A and 3C, 4A and 4C, 5A and 5C, 6A and 6C, and 7A and 7C respectively. Multiple oxide layers 824 may be analogous or similar to multiple oxide layers 324, 424, 524, and 624, 724 of FIGS. 3A and 3C 4A and 4C, 5A and 5C, 6A and 6C, and 7A and 7C. Multiple hard mask layers 822 may be analogous or similar to multiple hard mask layers 322, 422, 522, 622, and 722 of FIGS. 3A and 3C, 4A and 4C, 5A and 5C, 6A and 6C, and 7A and 7C.

This view illustrates the complete etch of the first hard mask layer 822-1 using the dry etch material (illustrated as etchant material 841 in FIG. 8B). The portion of the peripheral component active mask that is removed may be planarized using a process using chemical mechanical polishing (CMP). The etchant material may also etch into the materials of the semiconductor structure. The etchant material may create an opening (e.g., 859-1, . . . , 859-6 hereinafter collectively referred to as openings 859) to deposit etch stop spacers. For example, as illustrated in this view, the first oxide material 824-1 and second hard mask material 822-2 may be etched where unprotected by the first etch stop spacer pillar and the second etch stop spacer pillar. The etchant material 841 may etch between the first etch stop spacer pillar and the second etch stop spacer pillar. The etchant material 841 may be selective to the materials of the semiconductor structure such that the etchant material 841 etches the materials of the semiconductor structure but does not etch the materials of the first etch stop spacer pillar and the second etch stop spacer pillar. The etchant material, the first etch stop spacer pillar, and the second etch stop spacer pillar may not be visible in this view.

Figure 9A:
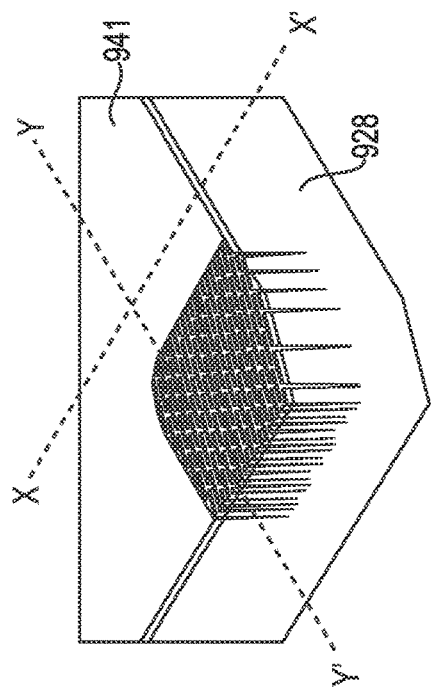
FIGS. 9A-9C illustrate an example method, at another stage of a semiconductor fabrication process, for array and peripheral area masking in accordance with a number of embodiments of the present disclosure.

FIG. 9A illustrates an example method, at another stage of a semiconductor fabrication process, for array and peripheral area masking in accordance with a number of embodiments of the present disclosure. This view shows a portion of the array of memory cells and its periphery. The substrate material 928 is analogous or similar to substrate material 328, 428, 528, 628, 728, and 828 of FIGS. 3A and 3C, 4A and 4C, 5A and 5C, 6A and 6C, 7A and 7C, and 8A and 8C respectively. The etchant material 941 is analogous or similar to etchant material 841 of FIG. 8A.

FIG. 9A illustrates an etchant material 941 covering the semiconductor structure to etch into the materials of the semiconductor structure. In the embodiment illustrated, the array active area may be untouched by the etchant material 941.

Figure 9B:
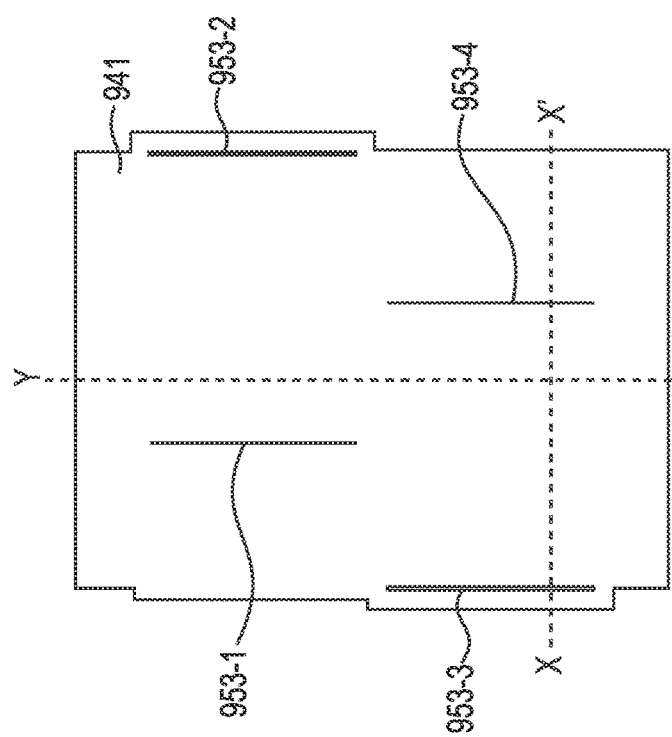

FIG. 9B illustrates an example method, at another stage of a semiconductor fabrication process, for array and peripheral area masking in accordance with a number of embodiments of the present disclosure. FIG. 9B illustrates a top down view of sensing circuitry, at a particular point in time, according to one or more embodiments. The layers that form the memory cell may not be visible from this view.

The dry etch material 941 may be viewed over the materials of the semiconductor structure below. The etchant material 941 may be deposited to create an opening to deposit etch stop spacers. The etchant material 941 may be deposited into the middle of the second etch stop spacer pillars 953.

Figure 9C:
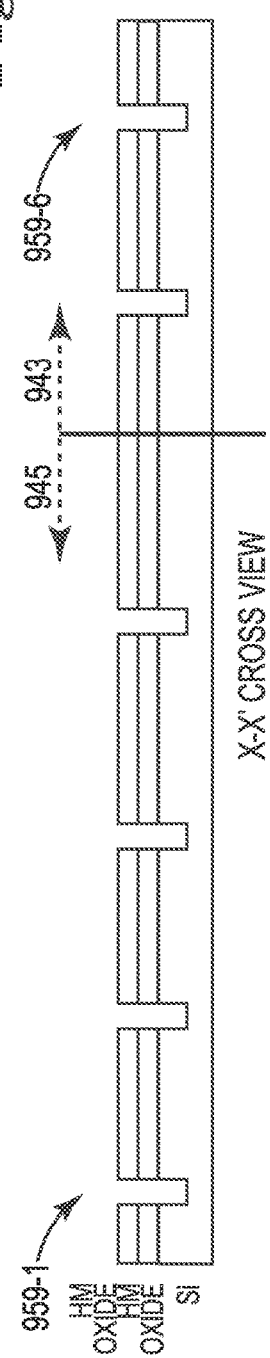

FIG. 9C illustrates an example method, at another stage of a semiconductor fabrication process, for array and peripheral area masking in accordance with a number of embodiments of the present disclosure. This view shows a cross-section of the array of memory cells and its periphery. The X-X' cross view and the Y-Y' cross view may refer to the cross-sections delineated in FIGS. 9A and 9B. Arrow 945 represents the cross-section of the array active area and arrow 943 represents the cross-section of the peripheral component active area. The Y-Y' cross view also represents the cross-section of the array active area. The silicon substrate layer 928 may be analogous or similar to silicon substrate layer 328, 428, 528, 628, 728, and 828 of FIGS. 3A and 3C, 4A and 4C, 5A and 5C, 6A and 6C, 7A and 7C, and 8A and 8C respectively. Oxide layer 924 may be analogous or similar to multiple oxide layers 324, 424, 524, 624, 724, and 824 of FIGS. 3A and 3C, 4A and 4C, 5A and 5C, 6A and 6C, 7A and 7C, and 8C. Hard mask layer 922 may be analogous or similar to multiple hard mask layers 322, 422, 522, 622, 722, and 822 of FIGS. 3A and 3C, 4A and 4C, 5A and 5C, 6A and 6C, 7A and 7C, and 8C.

This view illustrates the complete etch of the first oxide material 924-1 using the dry etch material (illustrated as etchant material 941 in FIG. 9B). The etchant material may also etch into the materials of the semiconductor structure through the spaces within the first etch stop spacer pillar and the second etch stop spacer pillars. The etchant material may be creating an opening (e.g., 959-1, . . . , 959-6 hereinafter collectively referred to as openings 959) to deposit etch stop spacers. For example, as illustrated in this view, the second hard mask material 922-2, second oxide material 924-2, and silicon substrate 928 may be etched where unprotected by the first etch stop spacer pillar and the second etch stop spacer pillar. The etchant material, the first etch stop spacer pillar, and the second etch stop spacer pillar may not be visible in this view.

FIG. 10A illustrates an example method, at another stage of a semiconductor fabrication process, for array and peripheral area masking in accordance with a number of embodiments of the present disclosure. This view shows a portion of the array of memory cells and its periphery. The substrate material 1028 is analogous or similar to substrate material 328, 428, 528, 628, 728, 828, and 928 of FIGS. 3A and 3C, 4A and 4C, 5A and 5C, 6A and 6C, 7A and 7C, 8A and 8C, and 9A and 9C respectively. The etchant material 1041 is analogous or similar to etchant material 841 and 941 of FIGS. 8A and 9A respectively.

FIG. 10A illustrates an etchant material 1041 covering the semiconductor structure to etch into the materials of the semiconductor structure. In the embodiment illustrated, the array active area may be untouched by the etchant material 1041.

FIG. 10B illustrates an example method, at another stage of a semiconductor fabrication process, for array and peripheral area masking in accordance with a number of embodiments of the present disclosure. FIG. 10B illustrates a top down view of sensing circuitry, at a particular point in time, according to one or more embodiments. The layers that form the memory cell may not be visible from this view.

The dry etch material 1041 may be viewed over the materials of the semiconductor structure below. The etchant material 1041 may be deposited to create an opening to deposit etch stop spacers.

FIG. 10C illustrates an example method, at another stage of a semiconductor fabrication process, for array and peripheral area masking in accordance with a number of embodiments of the present disclosure. This view shows a cross-section of the array of memory cells and its periphery. The X-X' cross view and the Y-Y' cross view may refer to the cross-sections delineated in FIGS. 10A and 9B. Arrow 1045 represents the cross-section of the array active area and arrow 1043 represents the cross-section of the peripheral component active area. The Y-Y' cross view also represents the cross-section of the array active area. The silicon substrate layer 1028 may be analogous or similar to silicon substrate layer 328, 428, 528, 628, 728, 828, and 928 of FIGS. 328, 428, 528, 628, 728, 828, and 928 of FIGS. 3A and 3C, 4A and 4C, 5A and 5C, 6A and 6C, 7A and 7C, 8A and 8C, and 9A and 9C respectively. Oxide layer 1024 may be analogous or similar to multiple oxide layers 324, 424, 524, 624, 724, 824, and 924 of FIGS. 328, 428, 528, 628, 728, 828, and 928 of FIGS. 3A and 3C, 4A and 4C, 5A and 5C, 6A and 6C, 7A and 7C, 8C, and 9C.

This view illustrates the complete etch of the second hard mask material using the dry etch material (illustrated as etchant material 1041 in FIG. 10B). The etchant material may also etch into the materials of the semiconductor structure. For example, the etchant material may flow into the spaces within the first etch stop spacer pillar and the second etch stop spacer pillar to create openings. For example, the etchant material may be creating an opening (to include opening) (e.g., 1059-1, . . . , 1059-6 hereinafter collectively referred to as openings 1059 to deposit etch stop spacers. For example, as illustrated in this view, the second oxide material 1024-2 and silicon substrate 1028 may be etched where unprotected by the first etch stop spacer pillar and the second etch stop spacer pillar. The etchant material, the first etch stop spacer pillar, and the second etch stop spacer pillar may not be visible in this view.

Figure 11A:
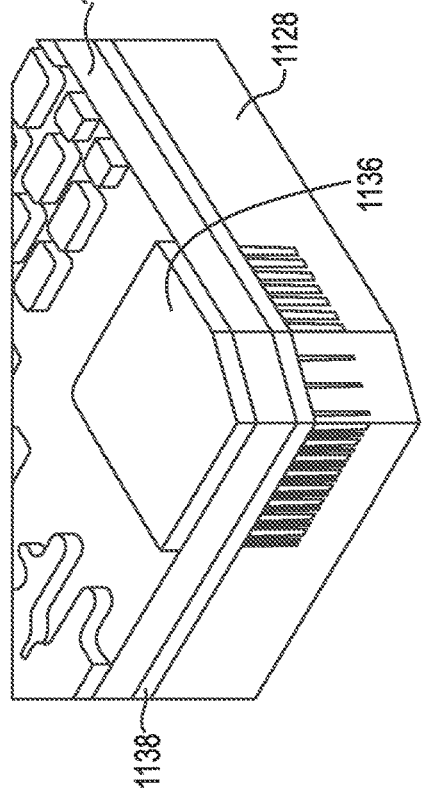
FIGS. 11A-11C illustrate an example method, at another stage of a semiconductor fabrication process, for array and peripheral area masking in accordance with a number of embodiments of the present disclosure.

FIG. 11A illustrates an example method, at another stage of a semiconductor fabrication process, for array and peripheral area masking in accordance with a number of embodiments of the present disclosure. This view shows a portion of the array of memory cells and its periphery. The silicon substrate layer 1128 may be analogous or similar to silicon substrate layer 328, 428, 528, 628, 728, 828, 928, and 1028 of FIGS. 328, 428, 528, 628, 728, 828, and 928 of FIGS. 3A and 3C, 4A and 4C, 5A and 5C, 6A and 6C, 7A and 7C, 8A and 8C, 9A and 9C, and 10A and 10C respectively. Oxide layer 1124 may be analogous or similar to multiple oxide layers 324, 424, 524, 624, 724, 824, 924, and 1024 of FIGS. 328, 428, 528, 628, 728, 828, and 928 of FIGS. 3A and 3C, 4A and 4C, 5A and 5C, 6A and 6C, 7A and 7C, 8C, 9C, and 10C A peripheral component active area mask 1136 may be formed in the array active area. This embodiment only applies when the peripheral component active area mask 1136 was not applied concurrently to both the peripheral component active area and the array active area prior to the etchant material was applied to the peripheral component active area. The peripheral component active area mask 1136 may be formed using photolithographic techniques to pattern a photolithographic mask. Peripheral component conductive contact vias may be opened using the peripheral component active area mask together with the formed etch stop spacer pillars. The opened peripheral conductive contact vias may later form local electrical interconnect to the peripheral component conductive contact.

Figure 11B:
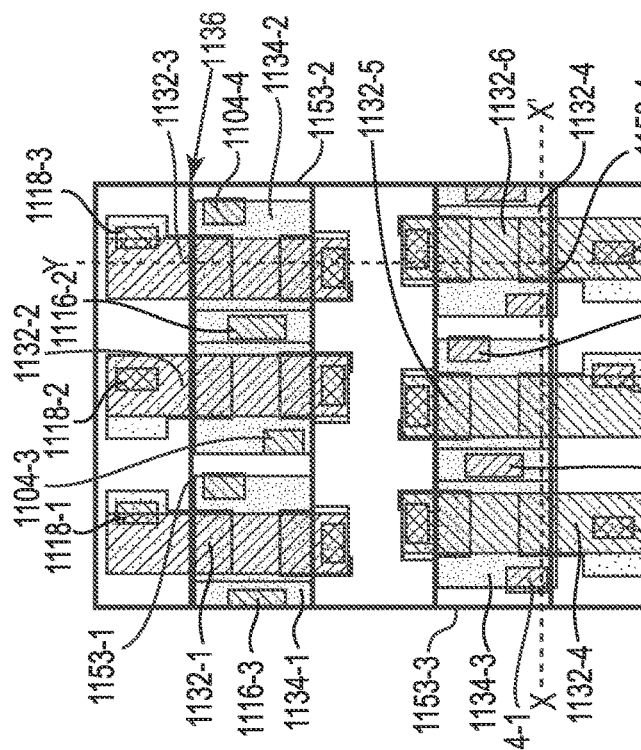

FIG. 11B illustrates an example method, at another stage of a semiconductor fabrication process, for array and peripheral area masking in accordance with a number of embodiments of the present disclosure. FIG. 11B illustrates a top down view of sensing circuitry, at a particular point in time, according to one or more embodiments. The layers that form the memory cell may not be visible from this view. The transistors 1132 may be analogous or similar to transistors 102 of FIG. 1 and transistors 232, 332, 432, 532, 632, and 732 of FIGS. 2A, 3, 4, 5, 6, and 7 respectively. The source/drain regions 1134 may be analogous or similar to source/drain region 102/105 of FIG. 1 and source/drain region 234, 334, 434, 534, and 634 of FIGS. 2A, 3B, 4B, 5B, 6B, and 7B respectively. The gates 1118 may be analogous or similar to gate 107 of FIG. 1 and gates 218, 318, 418, 518, and 618, and 718 of FIGS. 2A, 3B, 4B, 5B, 6B, and 7B respectively. The source 1116 may be analogous or similar to source 216, 316, 416, 516, 616, and 716 of FIGS. 2A, 3B, 4B, 5B, 6B, and 7B respectively. The drains 1104 may be analogous or similar to source 204, 304, 404, 504, 604, and 704 of FIGS. 2A, 3B, 4B, 5B, 6B, and 7B respectively.

The peripheral component active area mask is not illustrated in this view because this view illustrates the sensing circuitry which is not covered by the peripheral component active area mask in this embodiment. The second etch stop spacer pillars 1153 and the spaces 1149 between each pair of the spacer pillar may be visible from this view. The etching of a portion of the peripheral component active area to open peripheral component conductive contact vias using the peripheral component active area mask together with the etch stop spacers filled into openings within the etch stop spacer pillars may lead to a reduction of over-etched opening to a device well, increase surface area opening to a peripheral component conductive contact, and increase a landing margin for the sense amplifier.

Figure 11C:
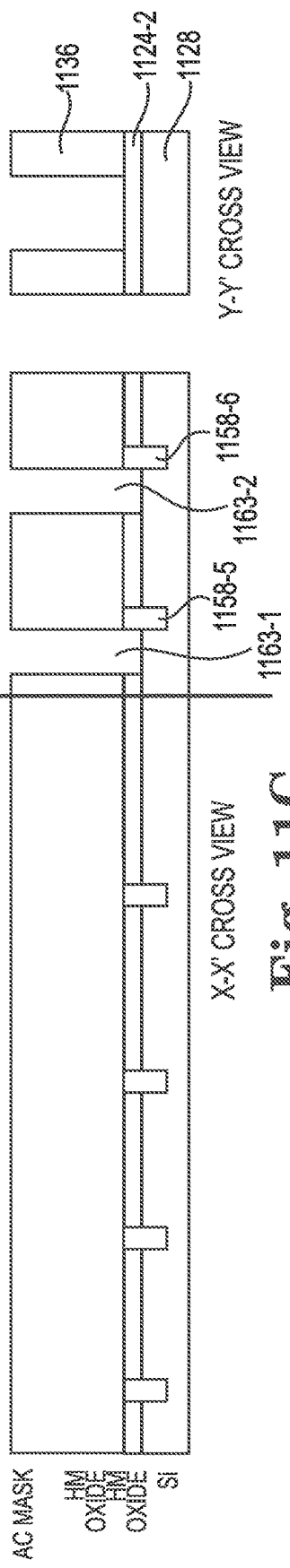

FIG. 11C illustrates an example method, at another stage of a semiconductor fabrication process, for array and peripheral area masking in accordance with a number of embodiments of the present disclosure. This view shows a cross-section of the array of memory cells and its periphery. The X-X' cross view and the Y-Y' cross view may refer to the cross-sections delineated in FIGS. 11A and 11B. Arrow 1145 represents the cross-section of the array active area and arrow 1143 represents the cross-section of the peripheral component active area. The Y-Y' cross view also represents the cross-section of the array active area. The silicon substrate layer 1128 may be analogous or similar to silicon substrate layer 328, 428, 528, 628, 728, 828, 928, and 1028 of FIGS. 328, 428, 528, 628, 728, 828, and 928 of FIGS. 3A and 3C, 4A and 4C, 5A and 5C, 6A and 6C, 7A and 7C, 8A and 8C, 9A and 9C, and 10A and 10C respectively. Oxide layer 1124 may be analogous or similar to multiple oxide layers 324, 424, 524, 624, 724, 824, 924, and 1024 of FIGS. 324, 424, 524, 624, 724, 824, 924, and 1024 of FIGS. 328, 428, 528, 628, 728, 828, and 928 of FIGS. 3A and 3C, 4A and 4C, 5A and 5C, 6A and 6C, 7A and 7C, 8C, 9C, and 10C.

This view illustrates the peripheral component active area mask 1136 over the materials of the semiconductor structure. The peripheral component active area mask 1136 may be formed over the etched materials of the semiconductor structure such as etched second oxide material 1124-2 and silicon substrate 1128. In this embodiment, the peripheral component active area mask 1136 may only be deposited on the array active area. Therefore, the peripheral component active area mask 1136 is only illustrated as a solid cover over the materials of the semiconductor structure in arrow 1145. The peripheral component active area mask 1136 is broken up to represent the areas in arrow 1143 where the peripheral component active area mask 1136 is not present. In an embodiment where the peripheral component active area mask 1136 is deposited concurrently on the peripheral component active area and the array active area, the peripheral component active area mask 136 may be visible in both arrow 1143 and arrow 1145.

Etch stop spacers 1158 (e.g., etch stop spacer 1158-5 and etch stop spacer 1158-6) may be formed within the openings (e.g., openings 1059 in FIG. 10C) created by an etchant material (e.g., etchant material 1041 in FIG. 10B). The etch stop spacers 1158 may be formed from an oxide material. Peripheral component conductive contact vias 1163 (e.g., via 1163-1 and via 1163-2) may be opened using the peripheral component active area mask and the etch stop spacers. The opened peripheral conductive contact vias 1163 may later form local electrical interconnect to the peripheral component conductive contact.

Figures 12A, 12B, 12C:
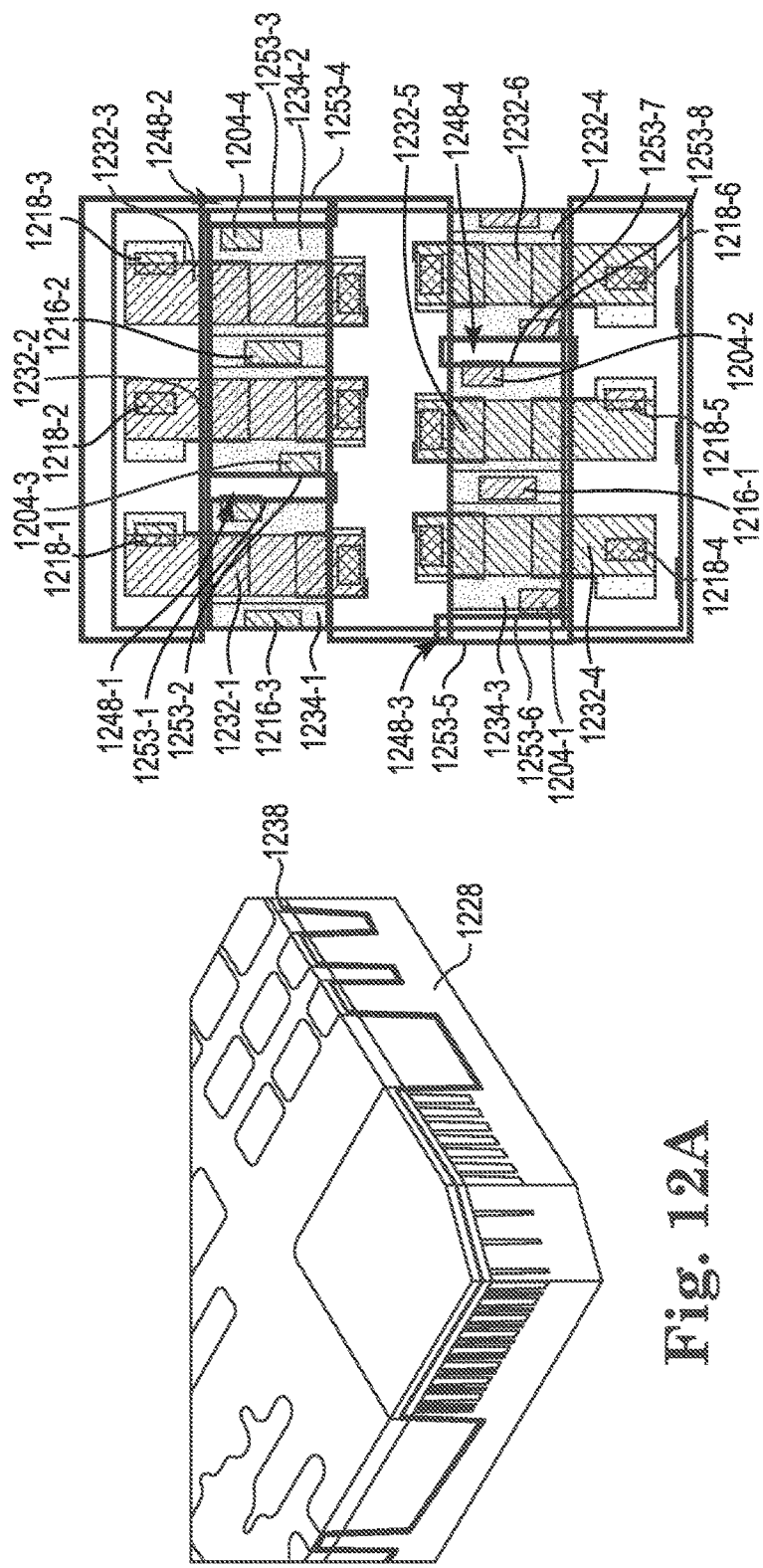
FIGS. 12A-12C illustrate an example method, at another stage of a semiconductor fabrication process, for array and peripheral area masking in accordance with a number of embodiments of the present disclosure.

FIG. 12A illustrates an example method, at another stage of a semiconductor fabrication process, for array and peripheral area masking in accordance with a number of embodiments of the present disclosure. This view shows a portion of the array of memory cells and its periphery.

A conductive material may be formed in the opened peripheral component conductive contact vias to form local electrical interconnect to the peripheral component conductive contact. The opened peripheral component conductive contact vias may have a diameter of ten (10) nanometers or less. The peripheral conductive contact vias may form a local electrical interconnect to a source/drain region of a p-type metal oxide semiconductor (PMOS) transistor in the peripheral active area. The local electrical interconnect may cross-couple a source/drain region of one transistor to a gate of another transistor in the peripheral component active area be formed using photolithographic techniques to pattern a photolithographic mask. The local electrical interconnect may cross-couple source/drain regions in one complementary metal oxide semiconductor (CMOS) transistor pair to gates of another CMOS transistor pair to form a sense amplifier in the peripheral area.

FIG. 12B illustrates a top down view of sensing circuitry, at a particular point in time, according to one or more embodiments. The layers that form the memory cell may not be visible from this view. The transistors 1232 may be analogous or similar to transistors 102 of FIG. 1 and transistors 232, 332, 432, 532, 632, 732, and 1132 of FIGS. 2A, 3B, 4B, 5B, 6B, 7B, and 11B respectively. The source/drain regions 1234 may be analogous or similar to source/drain region 102/105 of FIG. 1 and source/drain region 234, 334, 434, 534, and 634, 734, and 1134 of FIGS. 2A, 3B, 4B, 5B, 6B, 7B, and 11B respectively. The gates 1218 may be analogous or similar to gate 107 of FIG. 1 and gates 218, 318, 418, 518, and 618, 718, and 1118 of FIGS. 2A, 3B, 4B, 5B, 6B, 7B, and 11B respectively. The source 1216 may be analogous or similar to source 216, 316, 416, 516, 616, 716, and 1116 of FIGS. 2A, 3B, 4B, 5B, 6B, 7B, and 11B respectively. The drains may be analogous or similar to source 204, 304, 404, 504, 604, 704, and 1104 of FIGS. 2A, 3B, 4B, 5B, 6B, 7B, and 11B respectively.

Filling the openings with the etch stop spacers 1253 and creating the peripheral component conductive contact vias may lead to a reduction of over-etched opening to a device well, increase surface area opening to a peripheral component conductive contact, and increase a landing margin for the sense amplifier. The etch stop spacers 1253 within the spaces between each pair of the second etch stop spacer pillars 1253 to create an increased landing margin for the sense amplifier.

FIG. 12C illustrates an example method, at another stage of a semiconductor fabrication process, for array and peripheral area masking in accordance with a number of embodiments of the present disclosure. This view shows a cross-section of the array of memory cells and its periphery. The X-X' cross view and the Y-Y' cross view may refer to the cross-sections delineated in FIGS. 12A and 12B. Arrow 1245 represents the cross-section of the array active area and arrow 1243 represents the cross-section of the peripheral component active area. The Y-Y' cross view also represents the cross-section of the array active area. The silicon substrate layer 1128 may be analogous or similar to silicon substrate layer 328, 428, 528, 628, 728, 828, 928, and 1028 of FIGS. 328, 428, 528, 628, 728, 828, 928, 1028, and 1128 of FIGS. 3A and 3C, 4A and 4C, 5A and 5C, 6A and 6C, 7A and 7C, 8A and 8C, 9A and 9C, 10A and 10C, and 11A and 11C respectively. Oxide layer 1124 may be analogous or similar to multiple oxide layers 324, 424, 524, 624, 724, 824, 924, and 1024 of 324, 424, 524, 624, 724, 824, 924, and 1024 of FIGS. 328, 428, 528, 628, 728, 828, and 928 of FIGS. 3A and 3C, 4A and 4C, 5A and 5C, 6A and 6C, 7A and 7C, 8C, 9C, and 10C.

This view illustrates the complete etch of the second hard mask material. The peripheral component conductive contact vias 1263 may be formed adjacent the etch stop spacers (e.g., 1258-1, 1258-2, 1258-3, 1258-4 hereinafter collectively referred to as etch stop spacers 1258) to serve as a protection against over-etching the device well (as illustrated in FIG. 2B) and to increase surface area for licon landing margin for the sense amplifier. The etch stop spacers 1258 along with the peripheral component active area mask may create a barrier from additional etchant materials that lead to over-etching the device well which may lead to shorts.

FIG. 13A illustrates a cross-coupled latch in accordance with a number of embodiments of the present disclosure. The transistors 1332 may be analogous or similar to transistors 102 of FIG. 1 and transistors 232, 332, 432, 532, 632, 732, 1132, and 1232 of FIGS. 2A, 3B, 4B, 5B, 6B, 7B, 11B, and 12B respectively. The source/drain regions 1334 may be analogous or similar to source/drain region 102/105 of FIG. 1 and source/drain region 234, 334, 434, 534, and 634, 734, 1134, and 1234 of FIGS. 2A, 3B, 4B, 5B, 6B, 7B, 11B, and 12B respectively. The gates 1318 may be analogous or similar to gate 107 of FIG. 1 and gates 218, 318, 418, 518, and 618, 718, 1118, and 1218 of FIGS. 2A, 3B, 4B, 5B, 6B, 7B, 11B, and 12B respectively. The source 1316 may be analogous or similar to source 216, 316, 416, 516, 616, 716, 1116, and 1216 of FIGS. 2A, 3B, 4B, 5B, 6B, 7B, 11B, and 12B respectively. The drains 1304 may be analogous or similar to source 204, 304, 404, 504, 604, 704, 1104, and 1204 of FIGS. 2A, 3B, 4B, 5B, 6B, 7B, 11B, and 12B respectively.

The local electrical interconnect may cross-couple source/drain regions in one complementary metal oxide semiconductor (CMOS) transistor pair to gates of another CMOS transistor pair to form a sense amplifier in the peripheral area. For example, a first drain 1304-1 of a transistor 1332-3 may be coupled to a gate 1318-1 of another transistor 1332-1. A gate 1318-4 of a first transistor 1332-3 may be coupled to a drain of the another transistor 1332-1.

FIG. 13B illustrates a cross-coupled latch in accordance with a number of embodiments of the present disclosure.

The local electrical interconnect may cross-couple source/drain regions in one complementary metal oxide semiconductor (CMOS) transistor pair to gates of another CMOS transistor pair to form a sense amplifier in the peripheral area. N-channel transistors (e.g., NMOS transistors) 1317-1 and 1317-2 may be cross coupled with the gates of another pair of transistors, such as p-channel transistors (e.g., PMOS transistors) 1329-1 and 1329-2.

Figure 14:
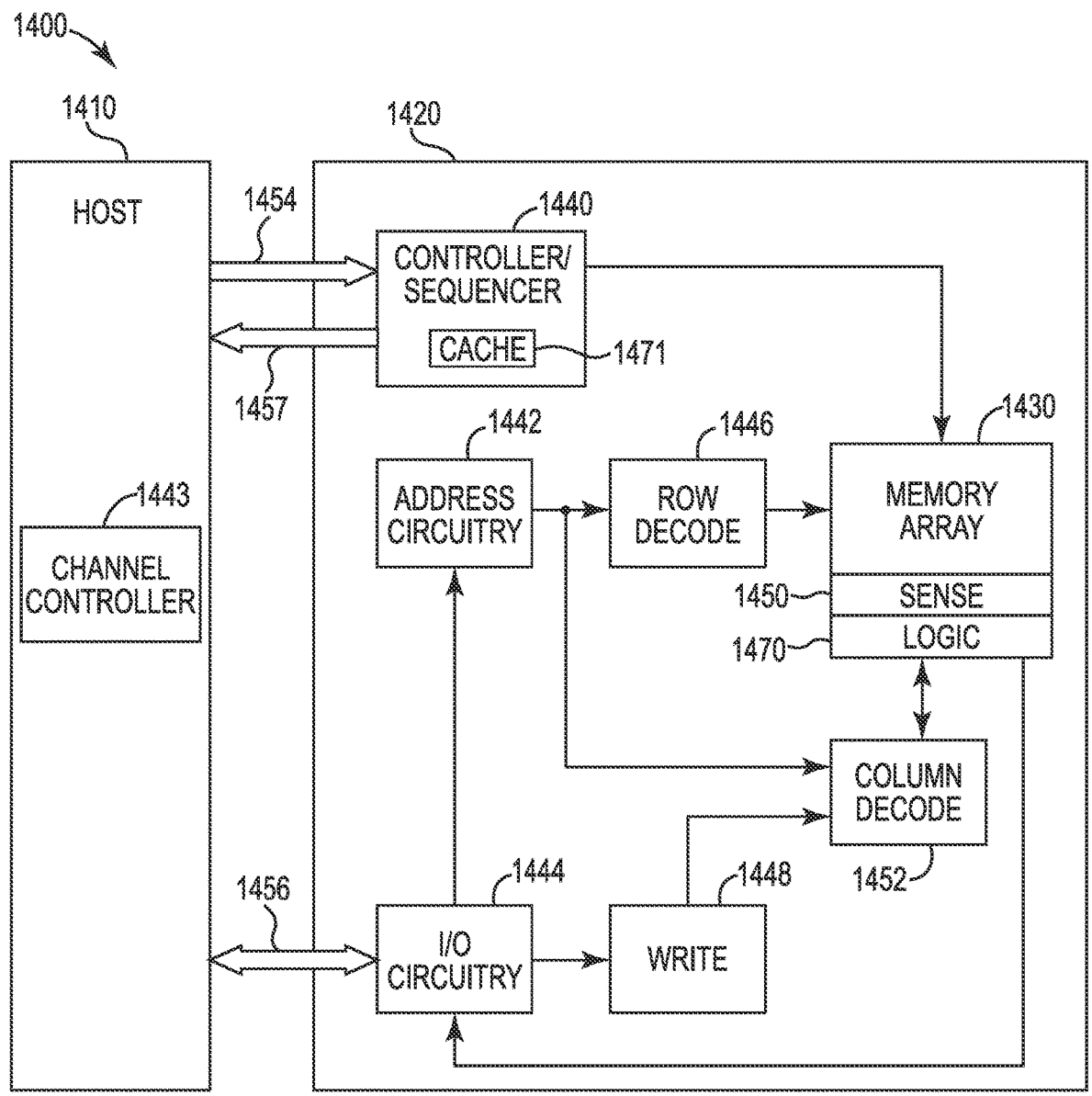
FIG. 14 is a block diagram of an apparatus in the form of a computing system including a memory device in accordance with a number of embodiments of the present disclosure.

FIG. 14 is a block diagram of an apparatus in the form of a computing system 1400 including a memory device 1420 in accordance with a number of embodiments of the present disclosure. As used herein, a memory device 1420, memory controller 1440, memory array 1430, sensing circuitry 1450, and logic circuitry 1470 might also be separately considered an "apparatus."

System 1400 includes a host 1410 coupled (e.g., connected) to memory device 1420, which includes a memory array 1430. Host 1410 can be a host system such as a personal laptop computer, a desktop computer, a digital camera, a smart phone, or a memory card reader, among various other types of hosts. Host 1410 can include a system motherboard and/or backplane and can include a number of processing resources (e.g., one or more processors, microprocessors, or some other type of controlling circuitry). The system 1400 can include separate integrated circuits or both the host 1410 and the memory device 1420 can be on the same integrated circuit. The system 1400 can be, for instance, a server system and/or a high performance computing (HPC) system and/or a portion thereof. Although the example shown in FIGS. 14A and 14B illustrates a system having a Von Neumann architecture, embodiments of the present disclosure can be implemented in non-Von Neumann architectures, which may not include one or more components (e.g., CPU, ALU, etc.) often associated with a Von Neumann architecture.

For clarity, the system 1400 has been simplified to focus on features with particular relevance to the present disclosure. The memory array 1430 can be a DRAM array, SRAM array, STT RAM array, PCRAM array, TRAM array, RRAM array, NAND flash array, and/or NOR flash array, for instance. The array 1430 can comprise memory cells arranged in rows coupled by access lines (which may be referred to herein as word lines or select lines) and columns coupled by sense lines, which may be referred to herein as data lines or digit lines. Although a single array 1430 is shown in FIG. 14, embodiments are not so limited. For instance, memory device 1420 may include a number of arrays 1430 (e.g., a number of banks of DRAM cells, NAND flash cells, etc.).

The memory device 1420 includes address circuitry 1442 to latch address signals provided over a bus 1456 (e.g., an I/O bus) through I/O circuitry 1444. Status and/or exception information can be provided from the controller 1440 on the memory device 1420 to a channel controller, through a high speed interface (HSI) including an out-of-band (OOB) bus, which in turn can be provided from the channel controller to the host 1410. Controller 1440 can include a cache 1471 for storing data. The cache 1471 can include a number of memory cells (e.g., SRAM Cell Array) and decode circuitry (e.g., muxes, gates, and row decoders). Address signals are received through address circuitry 1442 and decoded by a row decoder 1446 and a column decoder 1452 to access the memory array 1430. The address signals can also be provided to controller 1440. Data can be read from memory array 1430 by sensing voltage and/or current changes on the data lines using sensing circuitry 1450. The sensing circuitry 1450 can read and latch a page (e.g., row) of data from the memory array 1430. The I/O circuitry 1444 can be used for bi-directional data communication with host 1410 over the data bus 1456. The write circuitry 1448 is used to write data to the memory array 1430.

Controller 1440, e.g., bank control logic and/or sequencer, decodes signals provided by control bus 1454 from the host 1410. These signals can include chip enable signals, write enable signals, and address latch signals that are used to control operations performed on the memory array 1430, including data read, data write, and data erase operations. In various embodiments, the controller 1440 is responsible for executing instructions from the host 1410 and sequencing access to the array 1430. The memory controller 1440 can be a state machine, a sequencer, or some other type of controller. The controller 1440 can control shifting data (e.g., right or left) in an array (e.g., memory array 1430), as well as a number of instructions that are provided to the sensing circuitry 1450 and the logic 1470.

Examples of the sensing circuitry 1450 can comprise a number of sense amplifiers and a number of corresponding compute components, which may serve as, and be referred to herein as, accumulators and can be used to perform logical operations (e.g., on data associated with complementary data lines). The sensing circuitry 1450 may be used to perform logical operations (e.g., to execute instructions) in addition to logical operations performed by an external processing resource (e.g., host 1410). For instance, host 1410 and/or sensing circuitry 1450 may be limited to performing only certain logical operations and/or a certain number of logical operations.

Enabling an I/O line can include enabling (e.g., turning on) a transistor having a gate coupled to a decode signal (e.g., a column decode signal) and a source/drain coupled to the I/O line. However, embodiments are not limited to not enabling an I/O line. For instance, in a number of embodiments, the sensing circuitry (e.g., 1450) can be used to perform logical operations without enabling column decode lines of the array; however, the local I/O line(s) may be enabled in order to transfer a result to a suitable location other than back to the array 1430 (e.g., to an external register).

The controller 1440 can communicate with host 1410 via a data collection system. The data collections system can include a high speed interface such as control bus 1454, 00B 1457, and/or data bus 1456. The data collection system can also include memory cells that have an address that does not fall within the memory address range that is monitored.

While example embodiments including various combinations and configurations of sensing circuitry, sense amplifiers, compute component, dynamic latches, isolation devices, and/or shift circuitry have been illustrated and described herein, embodiments of the present disclosure are not limited to those combinations explicitly recited herein. Other combinations and configurations of the sensing circuitry, sense amplifiers, compute component, dynamic latches, isolation devices, and/or shift circuitry disclosed herein are expressly included within the scope of this disclosure.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combinations of the above embodiments and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method, comprising:
concurrently forming an array active area mask in an array active area and a peripheral component active area;
forming a peripheral component active area mask, separate from the array active area mask, in the peripheral component active area, wherein the peripheral component active area mask is formed over openings between etch stop spacer pillars, and wherein the etch stop spacer pillars are formed by the array active area mask;
concurrently forming etch stop spacers using the etch stop spacer pillars and the array active area mask in the array active area and the peripheral component active area; and
etching a portion of the peripheral component active area to open peripheral component conductive contact vias using the peripheral component active area mask together with the formed etch stop spacers in order to reduce over-etch of an opening to a device well while increasing surface area opening to a peripheral component conductive contact.

2. The method of claim 1, wherein the method further comprises depositing a conductive material in the opened peripheral component conductive contact via to form local electrical interconnect to the peripheral component conductive contact.

3. The method of claim 1, wherein the method further comprises using an opened peripheral conductive contact via to form a local electrical interconnect to a source/drain region of a p-type metal oxide semiconductor (PMOS) transistor in the peripheral active area.

4. The method of claim 1, wherein the method further comprises depositing a conductive material in an opened peripheral conductive contact via to form a local electrical interconnect cross-coupling a source/drain region of one transistor to a gate of another transistor in the peripheral component active area.

5. The method of claim 1, wherein the method further comprises depositing a conductive material in the opened peripheral conductive contact vias to electrically cross-couple source/drain regions in one complementary metal oxide semiconductor (CMOS) transistor pair to gates of another CMOS transistor pair to form a sense amplifier in the peripheral area.

6. The method of claim 1, wherein the method further comprises etching the portion of the peripheral component active area to open peripheral component conductive contact vias having a diameter of ten (10) nanometers or less.

7. A method, comprising:
concurrently forming an array active area mask in an array active area and a peripheral component active area;
concurrently forming a peripheral component active area mask, separate from the array active area mask, in the array active area and the peripheral component active area wherein the peripheral component active area mask is formed over openings between etch stop spacer pillars and wherein the etch stop spacer pillars are formed by the array active area mask;
concurrently forming oxide etch stop spacers using the etch stop spacer pillars and the array active area mask in the array active area and the peripheral component active area;

etching a portion of the peripheral component active area to open peripheral component conductive contact vias using the peripheral component active area mask together with the oxide etch stop spacers in order to increase a landing margin for a sense amplifier; and depositing a conductive material in the opened peripheral component conductive contact via to form a local electrical interconnect to the peripheral component conductive contact.

8. The method of claim 7, wherein forming the array active area mask comprises forming a photolithographic mask.

9. The method of claim 7, wherein forming peripheral component active area mask comprises forming a photolithographic mask.

10. The method of claim 7, wherein etching the portion of the peripheral component active area comprises etching into a silicon substrate.

11. The method of claim 7, wherein etching the portion of the peripheral component active area comprises using chemical mechanical polishing (CMP).

12. The method of claim 7, further comprising etching the portion of the peripheral component active area using a dry etch.

13. A method for forming vias in a peripheral area of a memory die, combining array and peripheral etch techniques, comprising:

concurrently forming an array active area mask in an array active area and a peripheral component active area;

concurrently forming a first etch stop spacer pillar and a second etch stop spacer pillar using the array active area mask in the array active area and the peripheral component active area;

forming a peripheral component active area mask in the peripheral component active area;

forming the peripheral component active area mask, separate from the array active area mask, in the array active area wherein the peripheral component active area mask is formed over openings between the first etch stop spacer pillar and the second etch stop spacer pillar;

concurrently forming an etch stop spacer into a space between the first etch stop spacer pillar and the second etch stop spacer pillar in the array active area and the peripheral component active area; and etching a portion of the peripheral component active area to open peripheral component conductive contact vias using the peripheral component active area mask together with the etch stop spacer in order to form a local electrical interconnect cross-coupling a source/drain region of one transistor to a gate of another transistor in the peripheral component active area.

14. The method of claim 13, wherein forming the first etch stop spacer pillar and the second etch stop spacer pillar comprises forming a dry strip.

15. The method of claim 13, further comprising etching the second etch stop spacer pillar prior to forming a peripheral component active area mask in the peripheral component active area.

16. The method of claim 13, further comprising depositing repeating iterations of a hard mask material and an oxide on a substrate to form a semiconductor structure in the array active area and the peripheral component active area.

17. The method of claim 16, wherein etching a portion of the peripheral component active area comprises etching materials within the semiconductor structure.

18. The method of claim 16, wherein etching the portion of the peripheral component active area comprises etching the depositions using an etch material selective to the materials within the semiconductor structure.

19. The method of claim 13, further comprising forming the memory die from a DRAM array of 1T1C (one transistor one capacitor) memory cells.

20. The method of claim 13, wherein forming the array active area mask using a photoresist material.

21. The method of claim 13, wherein forming a plurality of openings using the array active area mask, the first etch stop spacer pillar and the second etch stop spacer pillar.

* * * * *